(12) United States Patent
Gunji et al.

(10) Patent No.: US 12,120,927 B2
(45) Date of Patent: Oct. 15, 2024

(54) DISPLAY DEVICE INCLUDING BENDING PORTION WITH FRAME FLATTENING FILM AND SLITS

(71) Applicant: SHARP KABUSHIKI KAISHA, Sakai (JP)

(72) Inventors: Ryosuke Gunji, Sakai (JP); Tohru Okabe, Sakai (JP); Shinsuke Saida, Sakai (JP); Hiroki Taniyama, Sakai (JP); Shinji Ichikawa, Sakai (JP); Akira Inoue, Yonago (JP); Yoshihiro Nakada, Yonago (JP); Hiroharu Jinmura, Yonago (JP); Koji Tanimura, Yonago (JP); Yoshihiro Kohara, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 696 days.

(21) Appl. No.: 17/279,528

(22) PCT Filed: Sep. 28, 2018

(86) PCT No.: PCT/JP2018/036587
§ 371 (c)(1),
(2) Date: Mar. 24, 2021

(87) PCT Pub. No.: WO2020/066020
PCT Pub. Date: Apr. 2, 2020

(65) Prior Publication Data
US 2022/0115475 A1    Apr. 14, 2022

(51) Int. Cl.
*H10K 59/12* (2023.01)
*H10K 59/124* (2023.01)
(Continued)

(52) U.S. Cl.
CPC ............ *H10K 59/124* (2023.02); *H10K 71/00* (2023.02); *H10K 50/15* (2023.02); *H10K 50/16* (2023.02);
(Continued)

(58) Field of Classification Search
CPC ...... H10K 50/844; H10K 50/15; H10K 50/16; H10K 50/17; H10K 50/171; H10K 59/124;
(Continued)

(56) References Cited

U.S. PATENT DOCUMENTS

2018/0013095 A1* 1/2018 Choi ..................... H10K 50/844
2018/0047802 A1* 2/2018 Yoon ................... H10K 59/1213
(Continued)

FOREIGN PATENT DOCUMENTS

CN    108417604 A  *  8/2018  ......... H01L 27/3276
JP    2018-113104 A    7/2018

*Primary Examiner* — Ida M Soward
(74) *Attorney, Agent, or Firm* — ScienBiziP, P.C.

(57) ABSTRACT

A TFT layer and an organic EL element layer are provided in this order on a resin substrate layer, the TFT layer includes source wiring lines, high-level power source wiring lines, conductive portions including connection wiring lines between TFTs, and a flattening film covering the conductive portions provided on the interlayer insulating film, a frame region is provided with a bending portion including a portion where a slit is formed in an inorganic insulating film including the interlayer insulating film, and a flattening auxiliary film is provided between each adjacent ones of the conductive portions, formed of a material identical to a material of the frame flattening film that fills the slit of the bending portion, in a layer identical to a layer of the frame flattening film, and covered with the flattening film together with the conductive portions.

13 Claims, 12 Drawing Sheets

(51) Int. Cl.
*H10K 71/00* (2023.01)
*H10K 50/15* (2023.01)
*H10K 50/16* (2023.01)
*H10K 50/17* (2023.01)
*H10K 50/844* (2023.01)
*H10K 59/122* (2023.01)
*H10K 59/131* (2023.01)
*H10K 59/35* (2023.01)
*H10K 77/10* (2023.01)
*H10K 102/00* (2023.01)

(52) U.S. Cl.
CPC ........... *H10K 50/17* (2023.02); *H10K 50/171* (2023.02); *H10K 50/844* (2023.02); *H10K 59/12* (2023.02); *H10K 59/1201* (2023.02); *H10K 59/122* (2023.02); *H10K 59/131* (2023.02); *H10K 59/35* (2023.02); *H10K 59/352* (2023.02); *H10K 77/111* (2023.02); *H10K 2102/311* (2023.02)

(58) Field of Classification Search
CPC .... H10K 59/131; H10K 59/35; H10K 59/352; H10K 59/12; H10K 59/122; H10K 77/111; H10K 2102/311; G09F 9/30; H05B 33/02; H05B 33/22
See application file for complete search history.

(56) References Cited

U.S. PATENT DOCUMENTS

| | | | |
|---|---|---|---|
| 2018/0197484 A1* | 7/2018 | Moon | H01L 27/12 |
| 2018/0286938 A1* | 10/2018 | Moon | H10K 77/111 |
| 2018/0321764 A1* | 11/2018 | Oh | H10K 50/844 |
| 2018/0342707 A1* | 11/2018 | Lee | H10K 77/111 |
| 2018/0366586 A1* | 12/2018 | Son | H01L 27/1218 |
| 2019/0012031 A1* | 1/2019 | Kim | H10K 59/131 |
| 2019/0041915 A1* | 2/2019 | Park | H10K 59/1213 |
| 2019/0095007 A1* | 3/2019 | Jeong | H10K 59/873 |
| 2019/0164995 A1* | 5/2019 | Lee | H10K 77/111 |
| 2019/0326549 A1* | 10/2019 | Kokame | H10K 59/122 |
| 2021/0313412 A1* | 10/2021 | Okabe | H10K 59/1315 |

\* cited by examiner

DISPLAY DEVICE INCLUDING BENDING PORTION WITH FRAME FLATTENING FILM AND SLITS

TECHNICAL FIELD

The present disclosure relates to a display device and a manufacturing method thereof.

BACKGROUND ART

In recent years, a self-luminous type organic electroluminescence (EL) display device using an organic EL element has attracted attention as a display device that can replace liquid crystal display devices. As the organic EL display device, an organic EL display device having flexibility in which a thin film transistor (TFT) layer and an organic EL element layer are provided on a flexible resin substrate, has been proposed.

The TFT layer of the organic EL display device is provided, on a surface side thereof, a plurality of conductive portions, such as source wiring lines and power source wiring lines, and a flattening film for filling and flattening steps formed by the plurality of conductive portions, for example. The organic EL element layer includes a plurality of organic EL elements. Each organic EL element includes a first electrode provided on the flattening film, an organic EL layer provided on the first electrode, and a second electrode provided to overlap the first electrode with the organic EL layer interposed therebetween.

In general, in the organic EL display device, a display region that displays an image and a frame region located around the display region are provided, and reduction of the frame region is demanded. Therefore, in the flexible organic EL display device, it is known that the frame region is reduced by bending the frame region to place a terminal section provided on an end portion of the frame region, on a back side of the device.

In such an organic EL display device, in a case where an inorganic insulating film such as a gate insulating film or an interlayer insulating film that forms a TFT layer is in a bending portion, cracking due to bending tends to occur in the inorganic insulating film and it is concerned that moisture enters the display region from a point where the cracking has occurred, and so, the inorganic insulating film such as the gate insulating film or the interlayer insulating film that forms the TFT layer may be removed in order to prevent such a crack from occurring. In this case, a frame flattening film made of an organic material is provided in a slit from which the inorganic insulating film is removed, and a cross section of the TFT layer such as the inorganic insulating film exposed within the slit is sealed by the frame flattening film (for example, see PTL 1).

CITATION LIST

Patent Literature

PTL 1: JP 2018-113104 A

SUMMARY

Technical Problem

In an organic EL display device for performing high-resolution image display, conductive portions such as source wiring lines, power source wiring lines, or the like must be formed thick with thinning, and therefore, steps caused by the conductive portions cannot be completely filled even if a flattening film is formed. This causes unevenness to be formed on a surface of the flattening film, and unevenness reflecting the steps caused by the individual conductive portions is likely to remain on the surface of a TFT layer. The unevenness formed on the surface of the TFT layer destabilizes surface characteristics of a first electrode of an organic EL element formed on the TFT layer, which causes a light extraction efficiency of the organic EL element to be reduced.

For example, in a case where a top-emitting type organic EL element is employed in the organic EL display device, the first electrode is formed from a metal material having a good light reflection efficiency such as a silver alloy, whereas the second electrode is formed from a conductive material having high optical transparency such as indium tin oxide. In this case, the unevenness of the TFT layer surface is also reflected to the first electrode, so a reflected light on the first electrode is scattered, and as a result, the light extraction efficiency of the organic EL element is reduced.

The technique of the present disclosure has been made in light of the foregoing, and has an object to improve flattening accuracy of a TFT layer surface in a display device in which a light-emitting element layer such as an organic EL element layer is provided on a TFT layer.

Solution to Problem

A display device according to a technique of the present disclosure is a display device including: a substrate having flexibility and made of resin; a TFT layer provided on the substrate; and a light-emitting element layer provided on the TFT layer, a display region being configured to display an image through light emission in the light-emitting element layer, and a frame region being located around the display region, the TFT layer including an inorganic insulating film, a conductive portion provided on the inorganic insulating film, and a flattening film covering the conductive portion, the light-emitting element layer including a first electrode provided on the flattening film, a light emission function layer provided on the first electrode, and a second electrode overlapping the first electrode with the light emission function layer interposed between the second electrode and the first electrode, a terminal section being provided at an end portion of the frame region, a bending portion being provided in the frame region located between the display region and the terminal section, a slit being formed in the inorganic insulating film, a frame flattening film filling the slit, wherein a plurality of the conductive portions are provided at a position overlapping the first electrode and are adjacent to each other at intervals, and a flattening auxiliary film is provided between each adjacent ones of the plurality of conductive portions, the flattening auxiliary film being formed of a material identical to a material of the frame flattening film in a layer identical to a layer of the frame flattening film, the flattening auxiliary film being covered with the flattening film together with the conductive portions.

Advantageous Effects of Disclosure

According to the display device of the technique of the present disclosure, the flattening auxiliary film is provided between the adjacent conductive portions at the position overlapping the first electrode of the light-emitting element layer in the TFT layer, and the flattening film is provided to cover both the flattening auxiliary film and the conductive portions. Thus, the gap between the adjacent conductive portions is interpolated by the flattening auxiliary film, and in a state in which the gap is narrowed or eliminated, the surface of the TFT layer is flattened by the flattening film. As a result, the steps caused by the conductive portions can be reliably filled with the flattening film to suppress generation of the unevenness on the surface of the flattening film, which can improve the flattening accuracy of the surface of the TFT layer. As a result, the light extraction efficiency can be prevented from being reduced in the light-emitting element layer in the display device that performs high-resolution image display.

DESCRIPTION OF EMBODIMENTS

Exemplary embodiments will be described below detail with reference to the drawings.

Note that, in the following embodiments, a description that a constituent element such as a film, layer, element, or the like is provided or formed on another constituent element such as another film, layer, element, or the like means not only a case where a constituent element is provided directly on another constituent element, but also a case where, between a constituent element and another constituent element, still another constituent element such as still another film, layer, element, or the like is interposed.

Furthermore, in the following embodiments, a description that a constituent element such as a film, layer, element, or the like is connected to another constituent element such as another film, layer, element, or the like means that a constituent element is electrically connected to another constituent element unless otherwise specifically stated, and in a scope not departing from the gist of the technique of the present disclosure, includes not only a case meaning a direct connection but also a case meaning an indirect connection through still another constituent element such as still another film, layer, element, or the like, and may also include a case where a constituent element is integrated into another component element, that is, a portion of a constituent component constitutes another constituent component.

First Embodiment

Configuration of Organic EL Display Device

Figure 1:
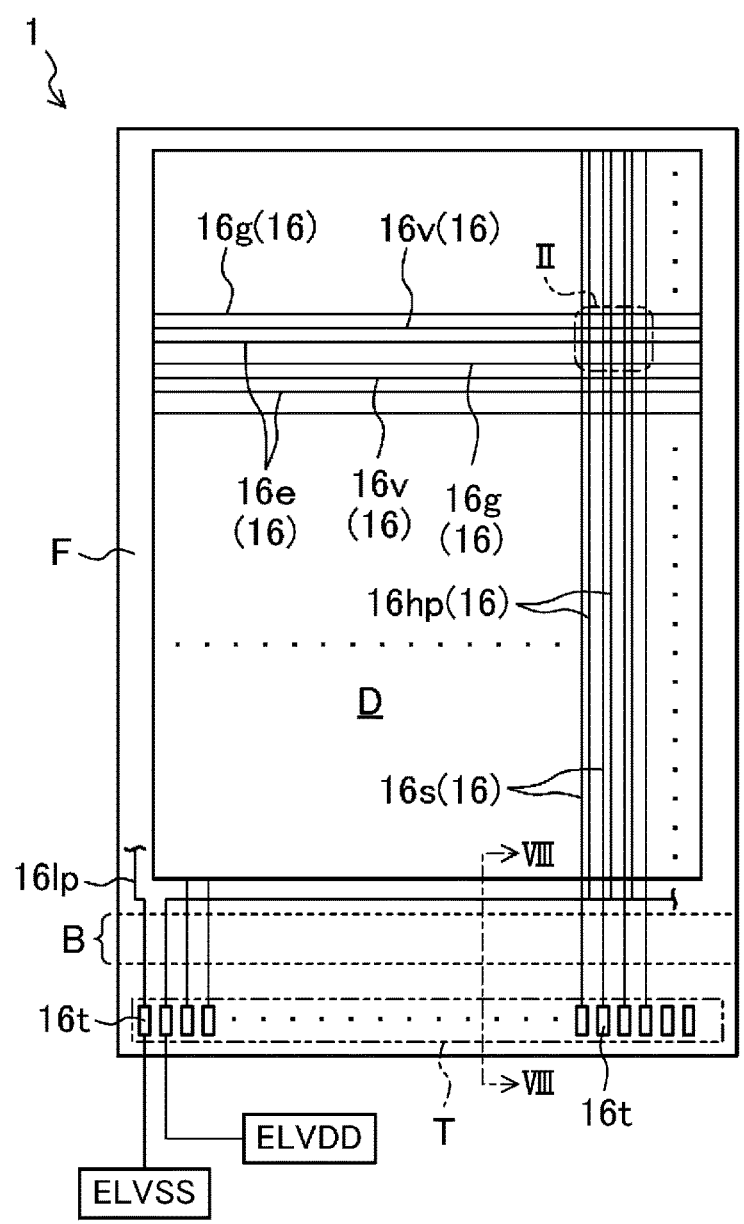
FIG. 1 is a plan view illustrating a schematic configuration of an organic EL display device according to a first embodiment.
Figure 2:
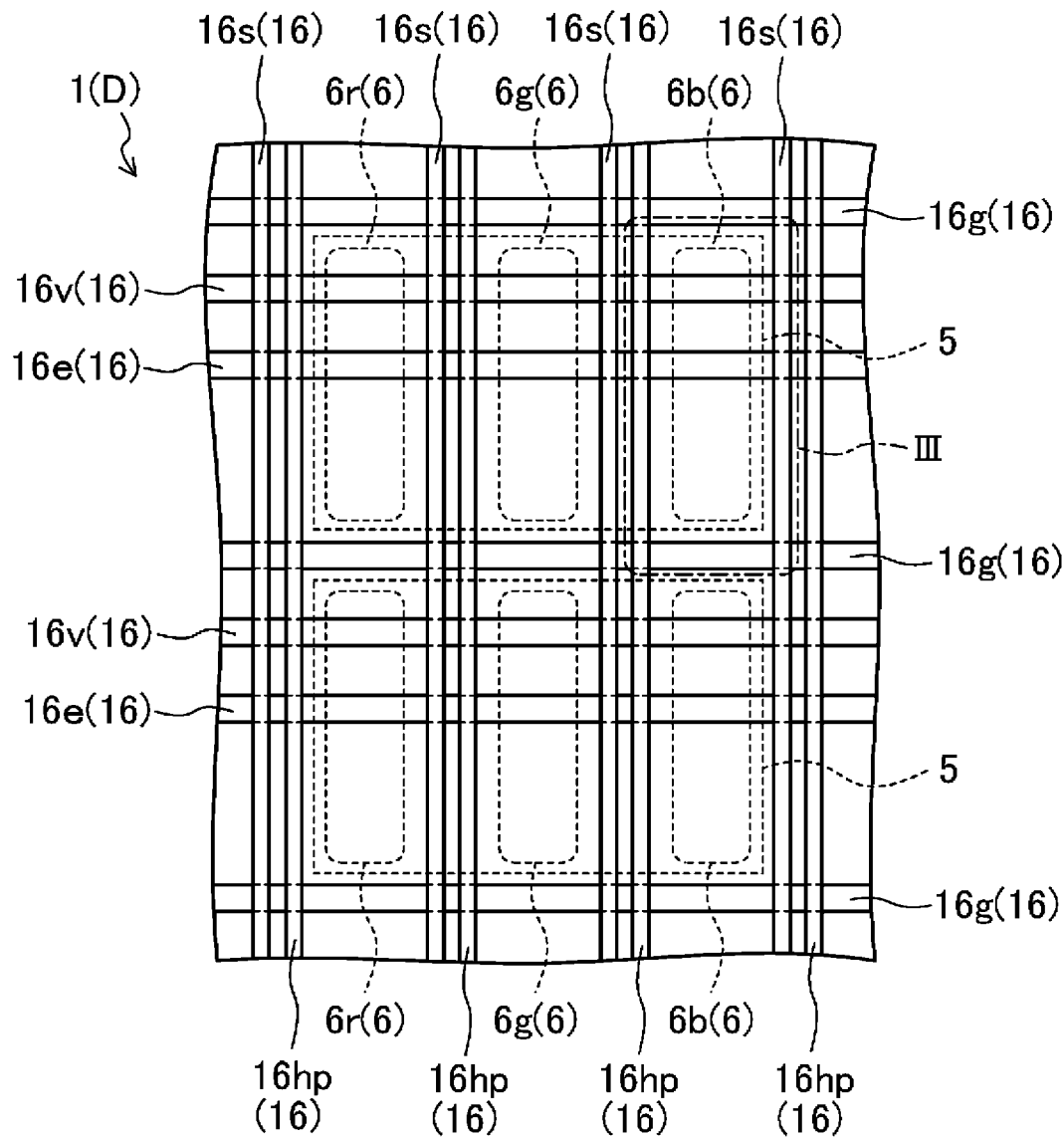
FIG. 2 is a plan view illustrating pixels in a display region surrounded by II in FIG. 1.
Figure 3:
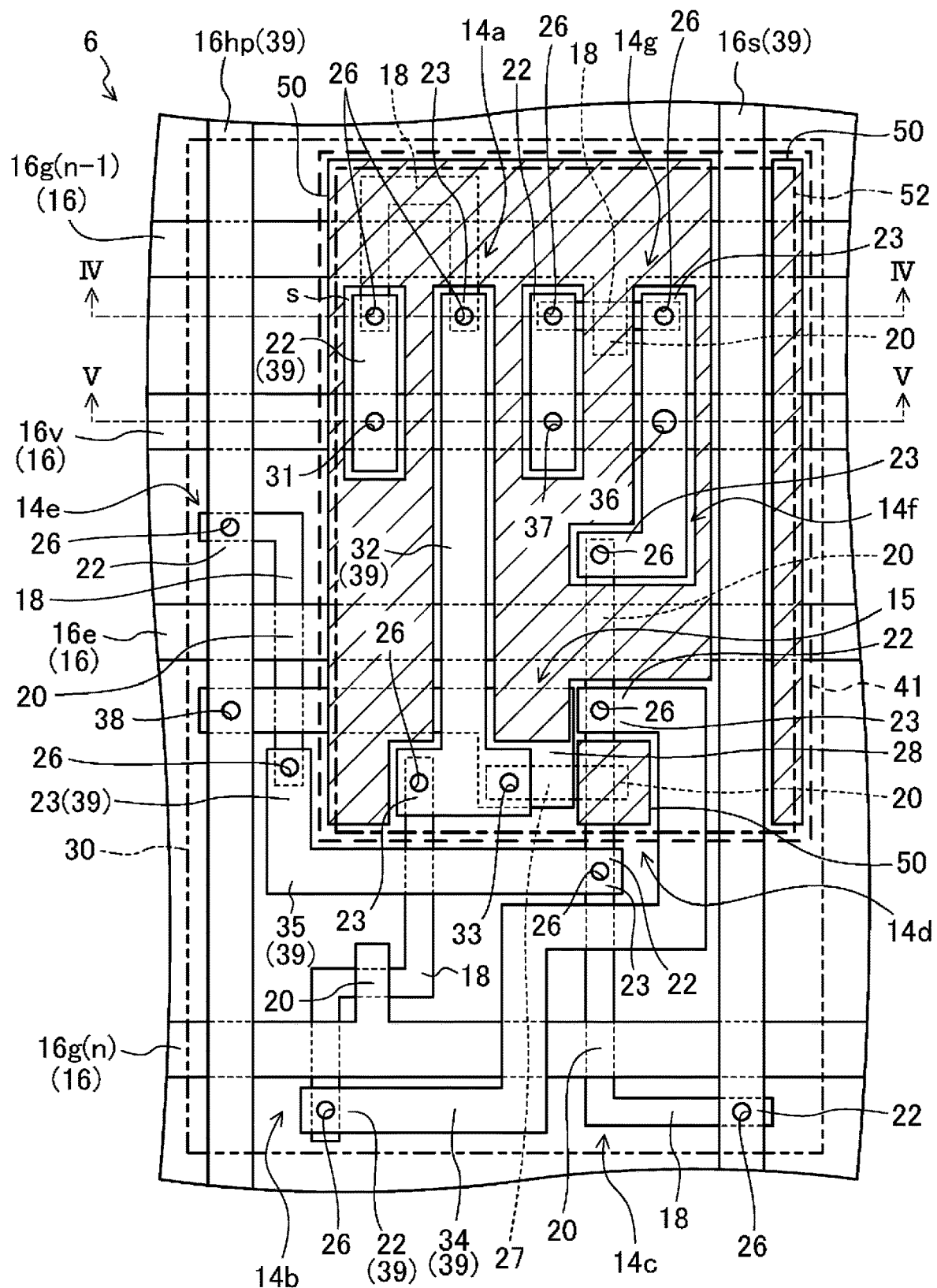
FIG. 3 is a plan view illustrating a schematic configuration of one subpixel surrounded by III in FIG. 2.
Figure 4:
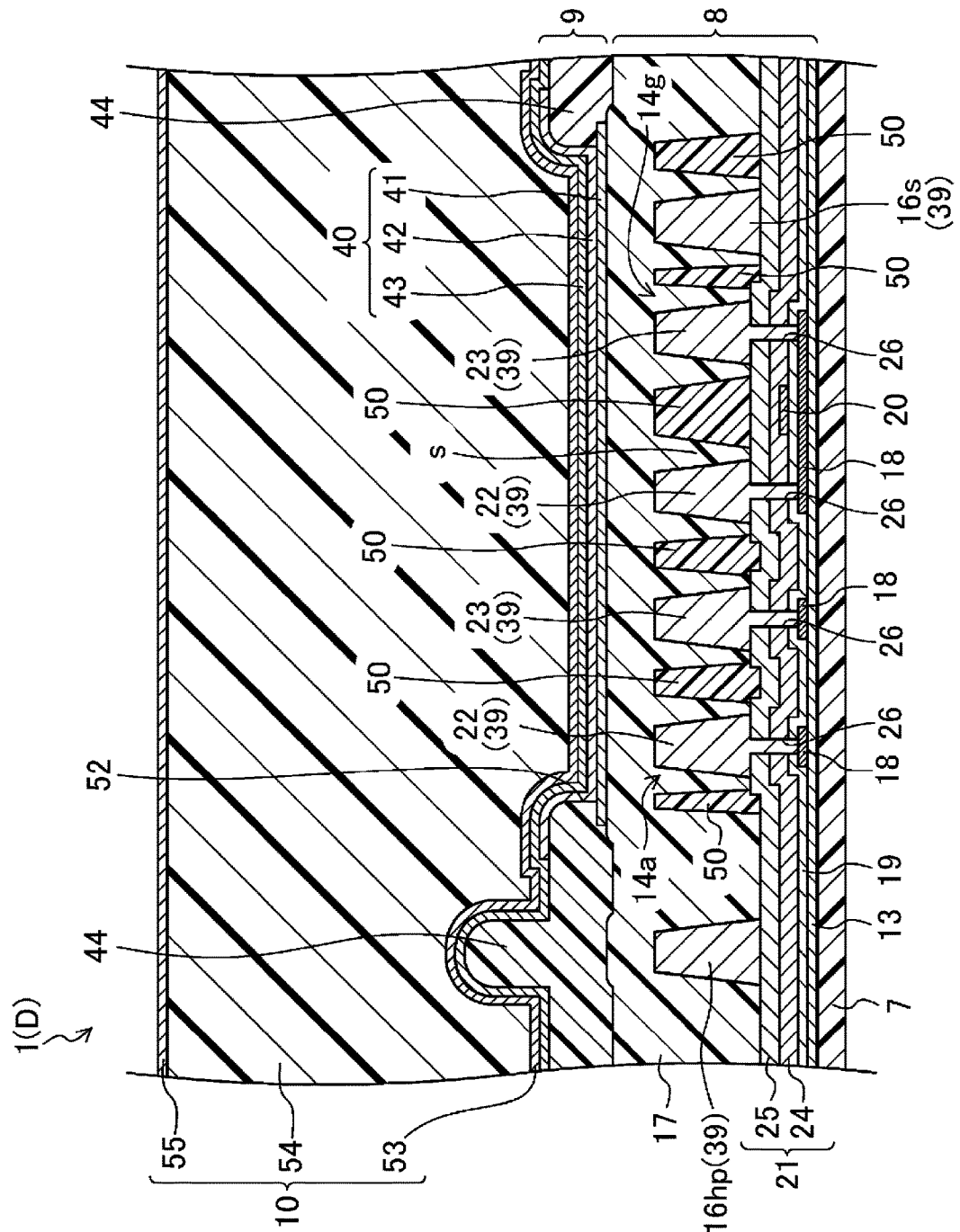
FIG. 4 is a cross-sectional view illustrating a schematic configuration of a portion of the subpixel taken along a line IV-IV in FIG. 3.
Figure 5:
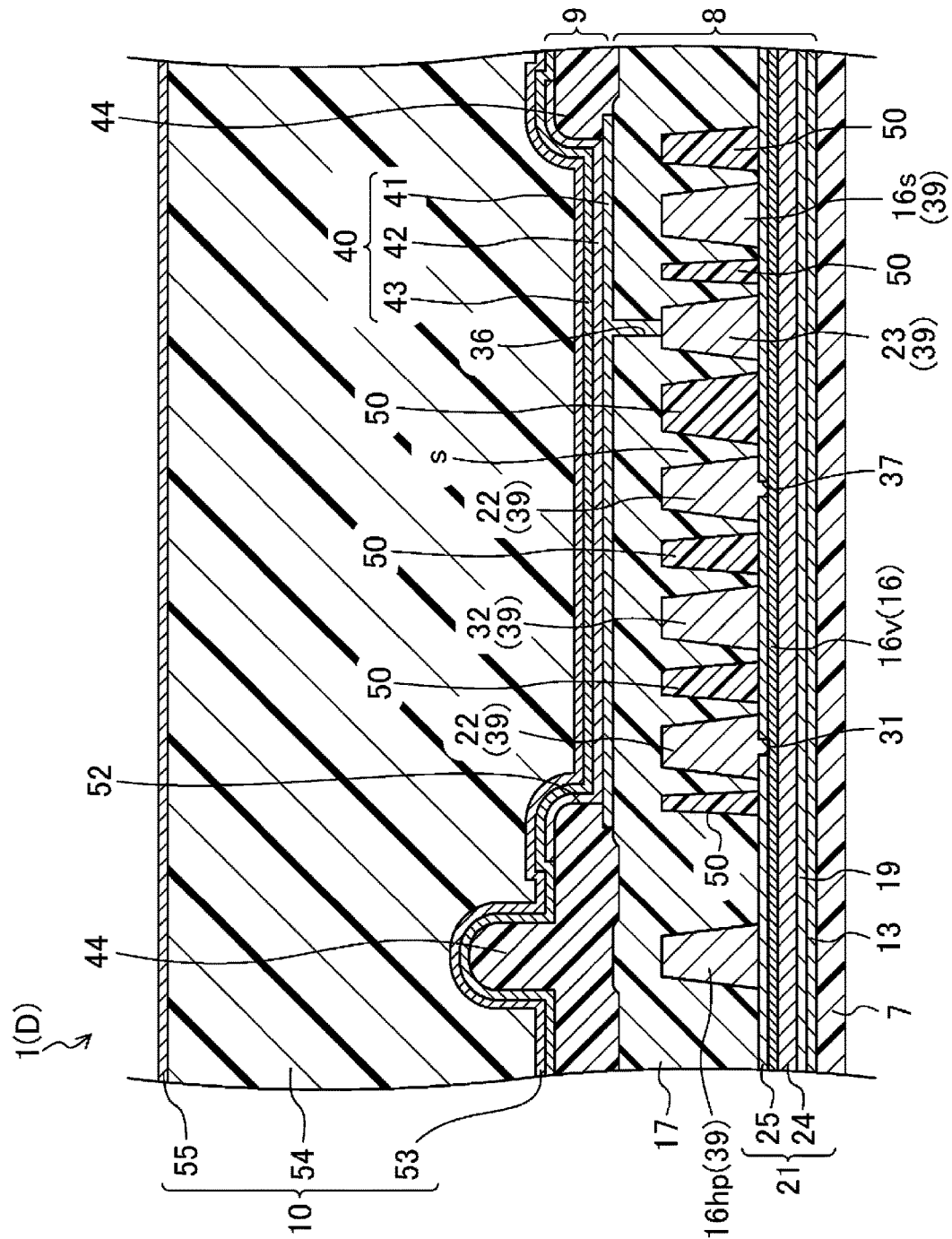
FIG. 5 is a cross-sectional view illustrating a schematic configuration of a portion of the subpixel taken along a line V-V in FIG. 3.
Figure 6:
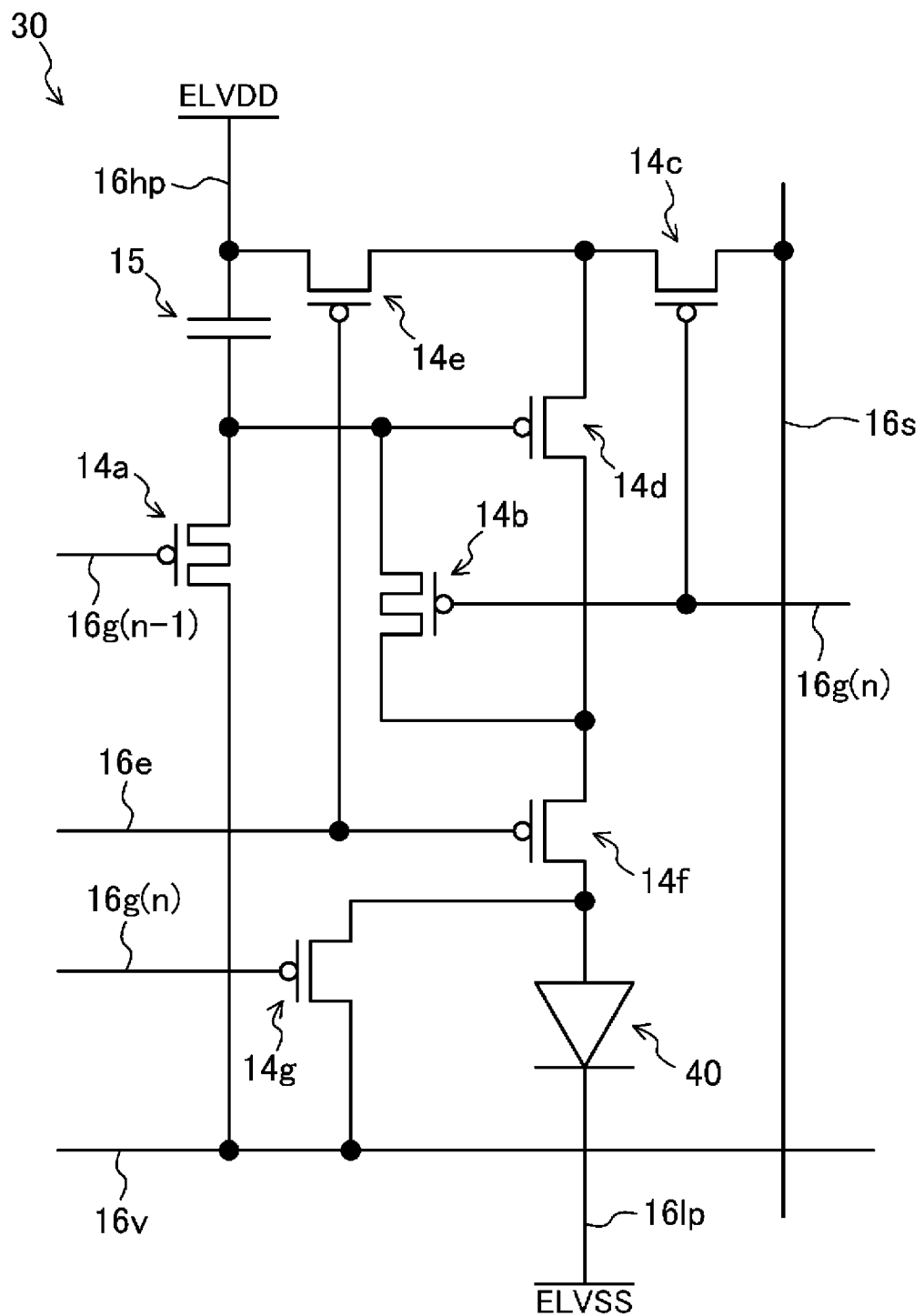
FIG. 6 is an equivalent circuit diagram of one subpixel illustrated in FIG. 3.
Figure 7:
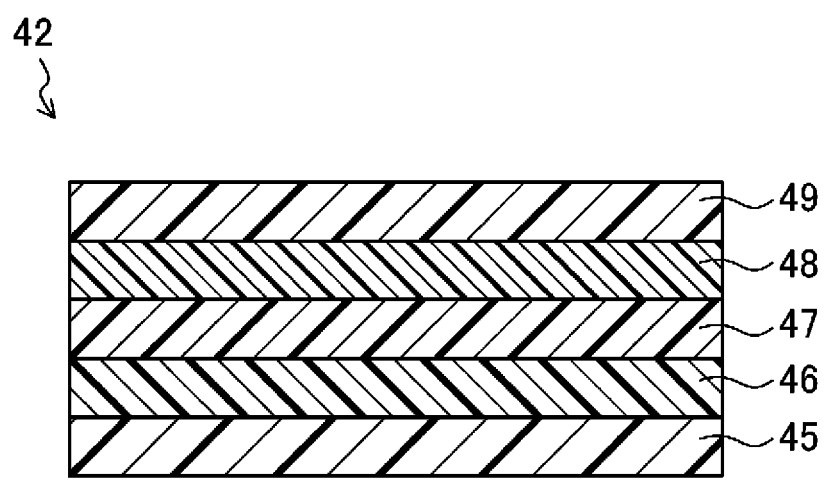
FIG. 7 is a cross-sectional view illustrating a layered structure of an organic EL layer included in the organic EL display device according to the first embodiment.
Figure 8:
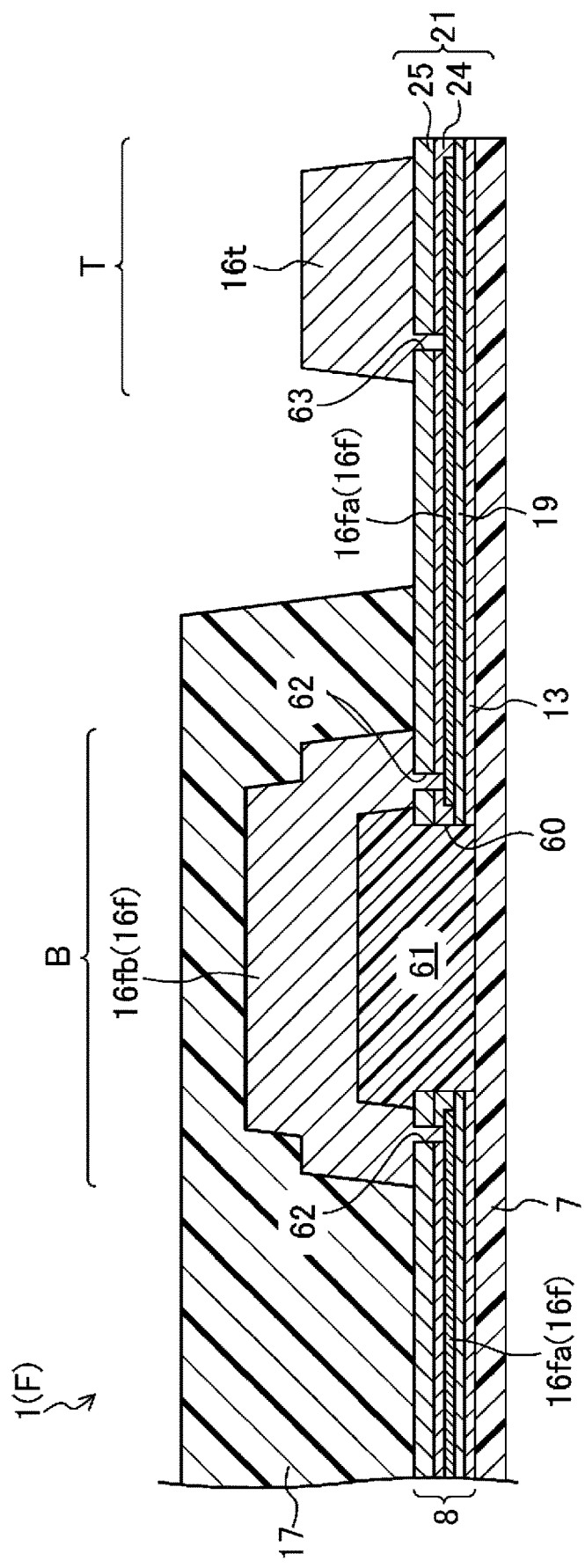
FIG. 8 is a cross-sectional view illustrating a schematic configuration of a bending portion of the organic EL display device taken along a line VIII-VIII in FIG. 1.

FIG. 1 is a plan view illustrating a schematic configuration of an organic EL display device 1 according to a first embodiment. FIG. 2 is a plan view illustrating pixels 5 in a display region D surrounded by II in FIG. 1. FIG. 3 is a plan view illustrating a schematic configuration of one subpixel 6 surrounded by III in FIG. 2. FIG. 4 is a cross-sectional view illustrating a schematic configuration of a portion of the subpixel 6 taken along a line IV-IV in FIG. 3. FIG. 5 is a cross-sectional view illustrating a schematic configuration of a portion of the subpixel 6 taken along a line V-V in FIG. 3. FIG. 6 is an equivalent circuit diagram of one subpixel 6 illustrated in FIG. 3. FIG. 7 is a cross-sectional view illustrating a layered structure of an organic EL layer 42 included in the organic EL display device 1. FIG. 8 is a cross-sectional view illustrating a schematic configuration of a bending portion B of the organic EL display device 1 taken along a life VIII-VIII in FIG. 1.

Schematic Configuration of Organic EL Display Device

As illustrated in FIG. 1, the organic EL display device 1 includes a display region D having a rectangular shape in which an image is displayed and a frame region F having a rectangular frame shape and located around the display region D. Then, a terminal section T to be connected to an external circuit is provided in a part constituting one side of the frame region F. Although not illustrated, a wiring line substrate such as a flexible printed circuit (FPC) provided with a display control circuit is connected to the terminal section T. The frame region F between the display region D and the terminal section T is provided with a bending portion B that is bent to place the terminal section T on a back side of the device.

In the frame region F, a portion that constitutes sides adjacent to the side where the terminal section T is provided (both left and right sides in FIG. 1) is provided with a monolithic control circuit such as a gate driver or an emission driver, and a conductive portion and a wiring line for conducting to an organic EL element 40 (second electrode 43) although not illustrated. Additionally, between the display region D and the terminal section T in the frame region F, a plurality of lead wiring lines 16f are provided. The plurality of lead wiring lines 16f include a low-level power source wiring line 16lp. Wiring line terminals 16t for conducting to the lead wiring lines 16f are arranged in a predetermined pattern in the terminal section T.

As illustrated in FIG. 2, the display region D includes a plurality of pixels 5. The plurality of pixels 5 are arranged in a matrix. Each of the pixels 5 includes, for example, subpixels 6 of three colors including a subpixel 6r for red gradation display, a subpixel 6g for green gradation display, and a subpixel 6b for blue gradation display. Those subpixels 6r, 6g, and 6b of the three colors are aligned with a juxtaposition, and are adjacent to one another in a stripe shape, for example. The organic EL display device 1 employs an active matrix driving method for controlling the gradation display with the individual subpixels 6 by active elements.

As illustrated in FIG. 4 and FIG. 5, the organic EL display device 1 includes a resin substrate layer 7, a TFT layer 8 provided on the resin substrate layer 7, an organic EL element layer 9 provided on the TFT layer 8, a sealing film 10 provided to cover the organic EL element layer 9, a surface protection film (not illustrated) provided on a surface of the organic EL element layer 9, and a back surface protection film (not illustrated) provided on the back face of the resin substrate layer 7.

Configuration of Resin Substrate Layer

The resin substrate layer 7 is formed, for example, from an organic material or a layered film of an inorganic insulating film and a resin film, and has flexibility, the organic material including a polyimide resin, a polyamide resin, an epoxy resin, an acrylic resin, a polysiloxane resin, and the like, the inorganic insulating film being made of an inorganic material including silicon oxide (SiOx), silicon nitride (SiNx), silicon oxynitride (SiOxNy; x>y), silicon nitride oxide (SiNxOy; x>y), and the like (where x and y are positive numbers, and hereinafter, the same is applied), the resin film being made of the above organic material. This resin substrate layer 7 is an example of a resin substrate.

Configuration of TFT Layer

The TFT layer 8 includes: a base coat film 13 provided on the resin substrate layer 7; a plurality of first TFTs 14a, a plurality of second TFTs 14b, a plurality of third TFTs 14c, a plurality of fourth TFTs 14d, a plurality of fifth TFTs 14e, a plurality of sixth TFTs 14f, and a plurality of seventh TFTs 14g, a plurality of capacitors 15, and various display wiring lines 16, which are provided on the base coat film 13; and a flattening film 17 that covers these first TFTs 14a, second TFTs 14b, third TFTs 14c, fourth TFTs 14d, fifth TFTs 14e, sixth TFTs 14f, seventh TFTs 14g, capacitors 15, and display wiring lines 16.

The base coat thin 13 includes a single-layer film or a layered film of an inorganic insulating layer of, for example, silicon oxide (SiOx), silicon nitride (SiNx), silicon oxynitride (SiOxNy; x>y), silicon nitride oxide (SiNxOy; x>y), or the like. The first TFT 14a, second TFT 14b, third TFT 14c, fourth TFT 14d, fifth TFT 14e, sixth TFT 14f, seventh TFT 14g, and the capacitor 15 are provided for each subpixel 6.

As illustrated in FIG. 2 and FIG. 3, the display wiring tines 16 includes a plurality of gate wiring lines 16g for transmitting gate signals, emission wiring lines 16e for transmitting light emission control signals, initialization voltage wiring lines 16v for supplying initialization voltages, a plurality of source wiring lines 16s for transmitting source signals, and a plurality of high-level power source wiring lines 16hp for supplying currents to the organic EL element 40. The same type of display wiring lines 16, that is, the gate wiring lines 16g, the emission wiring lines 16e, the source wiring lines 16s, and the high-level power source wiring lines 16hp, extend parallel to each other in the display region D.

The respective gate wiring lines 16g extend parallel to each other in a direction along the side where the terminal section T is provided. The respective emission wiring lines 16e and the respective initialization voltage wiring lines 16v extend parallel to each other in a direction along the gate wiring tines 16g. The respective source wiring lines 16s extend parallel to each other in a direction crossing the gate wiring lines 16g and the emission wiring lines 16e. The respective high-level power source wiring lines 16hp extend parallel to each other along the source wiring lines 16s.

The gate wiring tines 16g and the emission wiring lines 16e are formed of an identical material in an identical layer. The source wiring lines 16s and the high-level power source wiring lines 16hp are formed of an identical material in an identical layer. Only the initialization voltage wiring lines 16v are formed in a separate layer from the other display wiring lines 16g, 16e, 16s, and 16hp. These gate wiring lines 16g, emission wiring lines 16e, initialization voltage wiring lines 16v, source wiring lines 16s, and high-level power source wiring lines 16hp are insulated from each other, and are formed in a lattice pattern as a whole to partition each subpixel 6.

Each gate wiring tine 16g is connected to a gate driver in the frame region F. The gate driver sequentially switches the gate signals (high level or low level) to be applied to the plurality of gate wiring lines 16g, and selects, by scanning in a predetermined order, each gate wiring line 16g. Each emission wiring line 16e is connected to an emission driver in the frame region F. The emission driver sequentially switches the light emission control signals (high level or low level) to be applied to the plurality of emission wiring lines 16e, and selects, by scanning in a predetermined order, each emission wiring line 16e.

Each source wiring line 16s and each high-level power source wiring line 16hp are connected to the lead wiring line 16f and drawn from the display region D through the bending portion B to the terminal section T. Each source wiring line 16s is connected to a source driver included in the display control circuit on the wiring line substrate through the lead wiring line 16f and the wiring line terminal 15t. The source driver sequentially adjusts the source signals to be applied to the plurality of source wiring lines 16s in accordance with a display image, and selects, by scanning in a predetermined order, each source wiring line 16s. Each high-level voltage power source wiring line 16hp is electrically connected to a high-level voltage power source (ELVDD) through the wiring line terminal 16t.

Each of the first TFT 14a, second TFT 14b, third TFT 14c, fourth TFT 14d, fifth TFT 14e, sixth TFT 14f, and seventh TFT 14g is an example of an active element, and is, for example, a P-channel thin film transistor employing a top gate structure. Specifically, as illustrated in FIG. 3 and FIG. 4, each of these first to seventh TFTs 14a, 14b, 14c, 14d, 14e, 14f, and 14g includes an island-shaped semiconductor layer 18 provided on the base coat film 13, a gate insulating film 19 provided to cover the semiconductor layer 18, a gate electrode 20 overlapping a portion (channel region) of the semiconductor layer 18 with the gate insulating film 19 interposed therebetween, an interlayer insulating film 21 provided to cover the gate electrode 20, and a source electrode 22 and a drain electrode 23 that are provided on the interlayer insulating film 21.

The semiconductor layer 18 is formed of a low temperature polycrystalline silicon (LTPS), an oxide semiconductor, or the like, for example. The gate insulating film 19 includes a single-layer film or a layered film of an inorganic insulating layer of, for example, silicon oxide (SiOx), silicon nitride (SiNx), silicon oxynitride (SiOxNy; x>y), silicon nitride oxide (SiNxOy; x>y), or the like.

The gate electrode 20 is formed of a single-layer film or a layered film of a metal layer of, for example, aluminum (Al), tungsten (W), molybdenum (Mo), tantalum (Ta), chromium (Cr), titanium (Ti), copper (Cu) or the like. The gate wiring lines 16g and the emission wiring lines 16e are formed of a material identical to a material of the gate electrode 20 in a layer identical to a layer of the gate electrode 20.

The interlayer insulating film 21 includes a layered film of a first interlayer insulating film 24 and a second interlayer insulating film 25. Each of these first interlayer insulating film 24 and second interlayer insulating film 25 includes a single-layer film or a layered film of an inorganic insulating layer of, for example, silicon oxide (SiOx), silicon nitride (SiNx), silicon oxynitride (SiOxNy; x>y), silicon nitride oxide (SiNxOy; x>y), or the like.

The source electrode 22 and the drain electrode 23 are separated from each other, and are coupled to respective different parts (source region and drain region) at locations between which a region (channel region) of the semiconductor layer 18 overlapping the gate electrode 20 is interposed, through contact holes 26 formed in the gate insulating film 19 and the interlayer insulating film 21. The source electrode 22 and the drain electrode 23 are formed of a single-layer film or a layered film of a metal layer of, for example, aluminum (Al), tungsten (W), molybdenum (Mo), tantalum (Ta), chromium (Cr), titanium (Ti), copper (Cu), or the like. The source wiring lines 16s are formed of a material identical to a material of the source electrode 22 in a layer identical to a layer of the source electrode 22, and the high-level power source wiring lines 16hp are formed of a material identical to a material of the drain electrode 23 in a layer identical to a layer of the drain electrode 23.

The capacitor 15 includes a lower layer electrode 27 provided on the gate insulating film 19, the first interlayer insulating film 24 provided to cover the lower layer electrode 27, and an upper layer electrode 28 overlapping the lower layer electrode 27 with the first interlayer insulating film 24 interposed therebetween. The lower layer electrode 27 is formed of a material identical to a material of the gate wiring line 16g and the gate electrode 20 in a layer identical to a layer of the gate wiring line 16g and the gate electrode 20. The upper layer electrode 28 is formed of a material identical to a material of the initialization voltage wiring line 16v in a layer identical to a layer of the initialization voltage wiring line 16v.

The first TFT 14a, second TFT 14b, third TFT 14c, fourth TFT 14d, fifth TFT 14e, sixth TFT 14f, and seventh TFT 14g, the capacitor 15, and the various display wiring lines 16 (gate wiring line 16g, emission wiring line 16e, initialization voltage wiring line 16v, source wiring line 16s, and high-level power source wiring line 16hp) included in the TFT layer 8, and the organic EL element 40 included in the organic EL element layer 9 constitute a pixel circuit 30 illustrated in FIG. 6. The pixel circuit 30 is provided for each of the subpixels 6.

Hereinafter, a configuration of the pixel circuit 30 will be described focusing on one pixel circuit 30. Note that, in the description focusing on the pixel circuit 30, the gate wiring line 16g corresponding to the pixel circuit 30 focused on is referred to as a "corresponding gate wiring line" and is designated by a reference sign "16g(n)", and the gate wiring line 16g immediately before the corresponding gate wiring line 16g in the scanning order of the gate wiring lines 16g is referred to as a "preceding gate wiring line" and is designated by a reference sign "16g(n−1)". In addition, the emission wiring line 16e corresponding to the pixel circuit 30 focused on is referred to as a "corresponding emission wiring line", the initialization voltage wiring line 16v corresponding to the pixel circuit 30 focused on is referred to as a "corresponding initialization voltage wiring line", the source wiring line 16s corresponding to the pixel circuit 30 focused on is referred to as a "corresponding source wiring line", and the high-level power source wiring line 16hp corresponding to the pixel circuit 30 focused on is referred to as a "corresponding high-level power source wiring line".

As illustrated in FIG. 3 and FIG. 6, in the pixel circuit 30, the first TFT 14a is an initialization transistor provided between the preceding gate wiring line 16g(n−1), the corresponding initialization voltage wiring line 16v, and the capacitor 15, and functions as a switching element. At the first TFT 14a, the gate electrode 20 is integrally provided and connected to the preceding gate wiring line 16g(n−1), the source electrode 22 is connected to the initialization voltage wiring line 16v through a contact hole 31 formed in the second interlayer insulating film 25, the drain electrode 23 is formed integrally with a connection wiring line 32 and is connected to the lower layer electrode 27 of the capacitor 15 and the gate electrode 20 of the fourth TFT 14d through a contact hole 33 formed in the interlayer insulating film 21. The first TFT 14a applies a voltage of the initialization voltage wiring line 16v to the capacitor 15 in response to selection of the preceding gate wiring line 16g(n−1) to initialize the voltage applied to the gate electrode 20 of the fourth TFT 14d.

The second TFT 14b is a compensation transistor provided between the corresponding gate wiring line 16g(n) and the fourth TFT 14d, and functions as a switching element. At the second TFT 14b, the gate electrode 20 is integrally provided and connected to the corresponding gate wiring line 16g(n), the source electrode 22 is connected to the drain electrode 23 of the fourth TFT 14d and the source electrode 22 of the sixth TFT 14f through a connection wiring line 34, and the drain electrode 23 is connected to the gate electrode 20 of the fourth TFT 14d and the lower layer electrode 27 of the capacitor 15 through the contact hole 33 formed in the interlayer insulating film 21, and is connected to the drain electrode 23 of the first TFT 14a through the connection wiring line 32. The second TFT 14b sets the fourth TFT 14d in a diode connected state in response to selection of the corresponding gate wiring line 16g(n) to compensate for a threshold voltage of the fourth TFT 14d.

The third TFT 14c is a writing transistor provided between the corresponding gate wiring line 16g(n), the corresponding source wiring line 16s, and the fourth TFT 14d, and functions as a switching element. At the third TFT 14c, the gate electrode 20 is integrally provided and connected to the corresponding gate wiring line 16g(n), the source electrode 22 is integrally provided and connected to the corresponding source wiring line 16s, and the drain electrode 23 is integrally provided and connected to the source electrode 22 of the fourth TFT 14d, and is connected to the drain electrode 23 of the fifth TFT 14e through a connection wiring line 35. The third TFT 14c applies a voltage of the corresponding source wiring line 16s to the source electrode 22 of the fourth TFT 14d in response to selection of the corresponding gate wiring line 16g(n).

The fourth TFT 14d is a drive transistor provided between the first TFT 14a, second TFT 14b, and capacitor 15, the third TFT 14c and fifth TFT 14e, and the sixth TFT 14f, and functions as a switching element. At the fourth TFT 14d, the gate electrode 20 is connected to the drain electrode 23 of the first TFT 14a and the drain electrode 23 of the second TFT 14b through the contact hole 33 formed in the interlayer insulating film 21, and is integrally provided and connected to the capacitor 15, the source electrode 22 is integrally provided and connected to the drain electrode 23 of the third TFT 14c, and is connected to the drain electrode 23 of the fifth TFT 14e through a connection wiring line 35, and the drain electrode 23 is integrally provided and connected to the source electrode 22 of the sixth TFT 14f, and is connected to the source electrode 22 of the second TFT 14*b* through the connection wiring line 34. The fourth TFT 14*d* applies a drive current to the source electrode 22 of the sixth TFT 14*f*, the drive current according to a voltage applied between the gate electrode 20 and the source electrode 22.

The fifth TFT 14*e* is a power-supplying transistor provided between the corresponding emission wiring line 16*e*, the corresponding high-level power source wiring line 16*hp*, and the third TFT 14*c* and fourth TFT 14*d*, and functions as a switching element. At the fifth TFT 14*e*, the gate electrode 20 is integrally provided and connected to the corresponding emission wiring line 16*e*, the source electrode 22 is integrally provided and connected to the corresponding high-level power source wiring line 16*hp*, and the drain electrode 23 is connected to the drain electrode 23 of the third. TFT 14*c* and the source electrode 22 of the fourth TFT 14*d* through the connection wiring line 35. The fifth TFT 14*e* applies a voltage of the corresponding high-level power source wiring line 16*hp* to the source electrode 22 of the fourth TFT 14*d* in response to selection of the corresponding emission wiring line 16*e*.

The sixth TFT 14*f* is a light emission control transistor provided between the corresponding emission wiring line 16*e*, the second TFT 14*b* and the fourth TFT 14*d*, and the organic EL element 40, and functions as a switching element. At the sixth TFT 14*f*, the gate electrode 20 is integrally provided and connected to the corresponding emission wiring line 16*e*, the source electrode 22 is integrally provided and connected to the drain electrode 23 of the fourth TFT 14*d*, and the drain electrode 23 is connected to a first electrode 41 of the organic EL element 40 through a contact hole 36 formed in the flattening film 17. The sixth TFT 14*f* applies the drive current to the organic EL element 40 in response to selection of the corresponding emission wiring line 16*e*.

The seventh TFT 14*g* is an anode electrode discharge transistor provided between the corresponding gate wiring line 16*g*(*n*), the corresponding initialization voltage wiring line 16*v*, and the organic EL element 40, and functions as a switching element. At the seventh TFT 14*g*, the gate electrode 20 is integrally provided and connected to the preceding gate wiring line 16*g*(*n*−1), the source electrode 22 is connected to the corresponding initialization voltage wiring line 16*v* through a contact hole 37 formed in the second interlayer insulating film 25, and the drain electrode 23 is integrally provided with the drain electrode 23 of the sixth TFT 14*f* and is connected to organic EL element 40. The seventh TFT 14*g* resets a charge accumulated in the anode electrode (first electrode 41) of the organic EL element 40 in response to selection of the preceding gate wiring line 16*g*(*n*−1).

The capacitor 15 is a data holding element provided between the corresponding high-level power source wiring line 16*hp* and the first TFT 14*a*, second TFT 14*b*, and fourth TFT 14*d*. In the capacitor 15, the lower layer electrode 27 is integrally provided and connected to the gate electrode 20 of the fourth TFT 14*d*, and is connected to the drain electrode 23 of the first TFT 14*a* and the drain electrode 23 of the second TFT 14*b* through the contact hole 33 formed in the interlayer insulating film 21, and the upper layer electrode 28 is connected to the corresponding high-level power source wiring line 16*hp* through a contact hole 38 formed in the second interlayer insulating film 25. The capacitor 15 is charged by the voltage of the corresponding source wiring line 16*s* when the corresponding gate wiring line 16*g*(*n*) is in a select state, and holds the voltage written by way of the charging to maintain the voltage applied to the gate electrode 20 of the fourth TFT 14*d* when the corresponding gate wiring line 16*g*(*n*) is in a non-select state.

In such a pixel circuit 30, the respective connection wiring lines 32, 34, and 35 that connect the associated TFTs among the first to seventh TFTs 14*a*, 14*b*, 14*c*, 14*d*, 14*e*, 14*f*, and 14*g* are formed of a material identical to a material of the source wiring line 16*s*, the high-level power source wiring line 16*hp*, and the source electrode 22 in a layer identical to a layer of the source wiring line 16*s*, the high-level power source wiring line 16*hp*, and the source electrode 22. These respective connection wiring lines 32, 34, and 35, the source electrodes 22 and drain electrodes 23 of the first to seventh TFTs, and the source wiring lines 16*s*, and the high-level power source wiring lines 16*hp* are conductive portions 39 provided on the interlayer insulating film 21. In other words, the plurality of conductive portions 39 provided on the interlayer insulating film 21 include the connection wiring lines 32, 34, and 35, the source electrodes 22 and drain electrodes 23 of the first to seventh TFTs 14*a*, 14*b*, 14*c*, 14*d*, 14*e*, 14*f*, and 14*g*, and the source wiring lines 16*s* and the high-level power source wiring lines 16*hp*. The plurality of conductive portions 39 are formed thicker than the gate wiring lines 16*g*, the emission wiring lines 16*e*, the initialization voltage wiring lines 16*v*, and the gate electrode 20. The thickness of the conductive portion 39 is, for example, approximately 0.5 μm to 1.5 μm.

The surface characteristics such as the degree of unevenness of the first electrode 41 included in the organic EL element 40 varies depending on flattening accuracy of the surface of the TFT layer 8 by means of the flattening film 17. In a case where only the plurality of conductive portions 39 relatively thick as described above are covered by the flattening film 17, the steps caused by the conductive portions are not completely filled, and then, unevenness occurs on the surface of the flattening film 17, and unevenness reflecting the steps caused by the individual conductive portions 39 is likely to remain on the surface of the TFT layer 8. The flattening accuracy of the surface of the TFT layer 8 affects the surface characteristics of the first electrode 41 included in the organic EL element 40, and is related to whether the light extraction efficiency of the organic EL element 40 is good or bad. Therefore, in the organic EL display device 1 according to the first embodiment, a flattening auxiliary film 50 is provided between adjacent conductive portions 39 in the display region D in order to increase the flattening accuracy of the surface of the TFT layer 8.

The flattening auxiliary film 50 is formed into an island shape to overlap a portion of the first electrode 41 that is exposed from an opening 52 of an edge cover 44, and a plurality of flattening auxiliary films 50 are provided inside the opening 52 of the edge cover 44 in a plan view (hatched areas in FIG. 3 are formation regions of the flattened auxiliary film 50). A thickness of the flattening auxiliary film 50 is equal to or greater than the thickness of the conductive portion 39, and is preferably the same as the thickness of the conductive portion 39 (the same as the thickness of the conductive portion 39 in the illustrated example). A slight gap s is provided between the flattening auxiliary film 50 and the conductive portion 39. The flattening auxiliary film 50 is formed from an organic material such as a photosensitive polyimide resin, and is covered with the flattening film 17 together with the conductive portion 39.

The flattening film 17 covers, in the display region D, other than a portion of the drain electrode 23 of the sixth TFT 14*f* to flatten the surface of the TET layer 8 so that the unevenness shape caused by the plurality of conductive portions 39, and the surface shapes of the first TFT 14a, the second TFT 14b, the third TFT 14c, the fourth TFT 14d, the fifth TFT 14e, the sixth TFT 14f, and the seventh TFT 14g are not reflected. Referring to main portions, the flattening film 17 is provided to fill the gap s between the flattening auxiliary film 50 and the conductive portion 39, and cover the flattening auxiliary film 50 and the conductive portion 39, and mitigates or eliminates the unevenness caused by the flattening auxiliary film 50 and the conductive portion 39 to make the surface of the TFT layer 8 flat. The flattening film 17 is formed from an organic material such as a photosensitive polyimide resin.

Configuration of Organic EL Element Layer

The organic EL element layer 9 is provided on the flattening film 17, and constitutes the display region D. This organic EL element layer 9 is an example of a light-emitting element layer, and includes a plurality of organic EL elements 40 provided for each subpixel 6. The organic EL element 40 employs a top-emitting type structure. Specifically, the organic EL element 40 includes a plurality of first electrodes 41 provided on a surface of the flattening film 17, an organic EL layer 42 serving as a function layer is provided on each of the first electrodes 41, and the second electrode 43 overlapping the first electrodes 41 with the organic EL layer 42 interposed therebetween.

The first electrodes 41 are arranged in a matrix where the first electrodes 41 are provided to the respective subpixels 6, and are each connected to the drain electrode 23 of the sixth TFT 14f in the corresponding subpixel 6 through the contact hole 36 formed in the flattening film 17. It is preferable that the first electrodes 41 have a function to inject holes into the organic EL layers 42 and light reflectivity, and be formed of a material having a large work function to improve the hole injection efficiency into the organic EL layers 42.

Examples of a material of the first electrode 41 include a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb).

Additionally, examples of a material of the first electrode 41 may include an alloy of magnesium (Mg)-copper (Cu), an alloy of magnesium (Mg)-silver (Ag), an alloy of sodium (Na)-potassium (K), an alloy of astatine (At)-astatine oxide (AtO$_2$), an alloy of lithium (Li)-aluminum (Al), and an alloy of lithium (Li)-calcium (Ca)-aluminum (Al).

Additionally, examples of the material of the first electrode 41 may include a conductive oxide such as tin oxide (SnO), zinc oxide (ZnO), indium tin oxide (ITO), and indium zinc oxide (IZO). Additionally, the first electrode 41 may be formed by layering a plurality of layers including the materials described above. Note that examples of the material having a large work function include indium tin oxide (ITO) and indium zinc oxide (IZO).

Each of the first electrodes 41 of adjacent subpixels 6 are partitioned by the edge cover 44 provided on the flattening film 17. The edge cover 44 is formed in a lattice pattern and covers the peripheral edge portion of each of the first electrodes 41. Examples of a material of the edge cover 44 include inorganic compounds such as silicon oxide, silicon nitride, and silicon oxynitride, and organic materials such as a polyimide resin, an acrylic resin, a polysiloxane resin, and a novolak resin.

The organic EL layer 42 is an example of a light emission function layer, and is provided for each of the subpixels 6. The organic EL layer 42 has a structure in which a hole injection layer 45, a hole transport layer 46, a light-emitting layer 47, an electron transport layer 48, and an electron injection layer 49 are layered on the first electrode 4 in this order as illustrated in FIG. 7. These hole injection layer 45, hole transport layer 46, light-emitting layer 47, electron transport layer 48, and electron injection layer 49 are formed in thin film patterns by using a film formation mask, and are, for example, vapor deposition films formed by a vacuum vapor deposition technique.

The hole injection layer 45 is also referred to as an anode buffer layer, and functions to reduce the energy level difference between the first electrode 41 and the organic EL layer 42, to improve the efficiency of hole injection into the organic EL layer 42 from the first electrode 41. Examples of the material of the hole injection layer 45 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 46 functions to migrate positive holes to the light-emitting layer 47 efficiently. Examples of a material of the hole transport layer 46 include a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 47 functions to recouple the holes injected from the first electrode 41 and the electrons injected from the second electrode 43 and emit light in a case that a voltage is applied by the first electrode 41 and the second electrode 43. The light-emitting layer 47 is formed of a material that varies in accordance with a luminescent color (for example, red, green, or blue) of the organic EL element 40 in the individual subpixels 6.

Examples of a material of the light-emitting layer 47 include a metal oxinoid compound (8-hydroxyquinoline metal complex), a naphthalene derivative, an anthracene derivative, a diphenylethylenc derivative, a vinyl acetone derivative, a triphenylamine derivative, a butadiene derivative, a coumarin derivative, a benzoxazole derivative, an oxadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, and polysilane.

The electron transport layer 48 functions to migrate electrons to the light-emitting layer 47 efficiently. Examples of a material of the electron transport layer 48 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound, as an organic compound.

The electron injection layer 49 is also referred to as a cathode buffer layer, and functions to reduce the energy level difference between the second electrode 43 and the organic EL layer 42, to improve the electron injection efficiency into the organic EL layer 42 from the second electrode 43. Examples of a material of the electron injection layer 49 include inorganic alkaline compounds, such as lithium fluoride (Lin, magnesium fluoride (MgF$_2$), calcium fluoride (CaF$_2$), strontium fluoride (SrF$_2$), and barium fluoride (BaF$_2$), aluminum oxide (Al$_2$O$_3$), and strontium oxide (SrO).

As illustrated in FIG. 4, the second electrode 43 is provided to and shared by the plurality of first electrodes 41 (that is, shared by the plurality of subpixels 6), and covers the organic EL layer 42. The second electrode 43 is electrically connected to the low-level power source wiring line 16lp to conduct to the low-level voltage power source (ELVSS) at the wiring line terminal 16t provided in the terminal section T through the low-level power source wiring line 16lp. It is preferable that the second electrode 43 have a function to inject electrons into the organic EL layer 42 and optical transparency, and be formed from a material having a small work function to improve the electron injection efficiency into the organic EL layer 42.

Examples of a material of the second electrode 43 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb).

Additionally, examples of a material of the second electrode 43 may include an alloy of magnesium (Mg)-copper (Cu), an alloy of magnesium (Mg)-silver (Ag), an alloy of sodium (Na)-potassium (K), an alloy of astatine (At)-astatine oxide (AtO$_2$), an alloy of lithium (Li)-aluminum (Al), and an alloy of lithium (Li)-calcium (Ca)-aluminum (Al).

Additionally, examples of q material of the second electrode 43 may include a conductive oxide such as tin oxide (SnO), zinc oxide (ZnO), indium tin oxide (ITO), and indium zinc oxide (IZO). Additionally, the second electrode 43 may be formed by layering a plurality of layers including the materials described above. Note that examples of the material having a small work function include magnesium (Mg), lithium (Li), lithium fluoride (LiF), an alloy of magnesium (Mg)-copper (Cu), an alloy of magnesium (Mg)-silver (Ag), an alloy of sodium (Na)-potassium (K), an alloy of lithium (Li)-calcium (Ca)-aluminum (Al), and an alloy of lithium fluoride (LiF)-calcium (Ca)-aluminum (Al).

The sealing film 10 functions to protect the organic EL element 40 from moisture, oxygen, or the like. As illustrated in FIG. 4, the sealing film 10 includes a first inorganic sealing film 53 provided to cover the second electrode 43, an organic sealing film 54 provided on the first inorganic sealing film 53, and a second inorganic sealing film 55 provided to cover the organic sealing film 54.

The first inorganic sealing film 53 and the second inorganic sealing film 55 are formed, for example, from an inorganic material such as silicon oxide (SiO$_2$), aluminum oxide (Al$_2$O$_3$), silicon nitride (SiNx) like trisilicon tetranitride (Si$_3$N$_4$), and silicon carbonitride (SiCN). The organic sealing film 54 is formed from an organic material such as an acrylic resin, an epoxy resin, a polyurea resin, a parylene resin, a polyimide resin, and a polyamide resin, for example.

The first inorganic sealing film 53, the organic sealing film 54, and the second inorganic sealing film 55 are provided in the entire display region D, and are also provided in the frame region F. Peripheral edges of the first inorganic scaling film 53 and the second inorganic seating film 55 are positioned on an outer side of a peripheral edge of the organic sealing film 54 in the frame region F, and are joined to each other. The organic sealing film 54 is encased by the first inorganic sealing film 53 and the second inorganic sealing film 55, and is encapsulated between the two inorganic seating films 53 and 55. Such a sealing film 10 is not provided to the bending portion B and the terminal section T.

As illustrated in FIG. 8, in the bending portion B, a slit 60 in a straight-linear form is provided in the inorganic insulating film provided on the resin substrate layer 7, that is, in the base coat film 13, the gate insulating film 19, and the interlayer insulating film 21, to divide the inorganic insulating films into the display region D and the terminal section T. The slit 60 is orthogonal to a bending direction of the bending portion B and extends along the terminal section T between the display region D and the terminal section T, and is formed to penetrate the base coat film 13, the gate insulating film 19, and the interlayer insulating film 21 to expose a surface of the resin substrate layer 7 from these inorganic insulating films 13, 19, and 21.

In this way, the portion of the frame region F where the slit 60 is formed, that is, the portion where the inorganic insulating films 13, 19, and 21 of the TFT layer 8 are removed, is easier to bend than the other portion is, and constitutes the bending portion B. The bending portion B is provided with a frame flattening film 61 to fill the slit 60. A cross section of the TFT layer 8 exposed in the slit 60 is sealed by this frame flattening film 61. The frame flattening film 61 is formed of a material identical to a material of the flattening auxiliary film 50 in a layer identical to a layer of the flattening auxiliary film 50, and is provided to have a thickness enough to cover a peripheral portion of an opening of the slit 60 and also rise over the interlayer insulating film 21. A thickness of the frame flattening film 61 on the interlayer insulating film 21 is thinner than the thickness of the flattening auxiliary film 50.

The lead wiring tine 16f drawn to the terminal section T via the bending portion B like this includes a lower layer wiring line 16fa extending between the gate insulating film 19 and the interlayer insulating film 21, and an upper layer wiring tine 16fb extending on the frame flattening film 61. The lower layer wiring line 16fa is divided into the display region D side and the terminal section T side with reference to a boundary where the slit 60 is provided. The lower layer wiring line 16fa is formed of a material identical to a material of the gate wiring line 16g and the emission wiring lines 16e in a layer identical to a layer of the gate wiring line 16g and the emission wiring lines 16e.

The upper layer wiring line 16fb extends from the display region D side of the frame flattening film 61 toward the terminal section T side to cross the slit 60, and is connected to the lower layer wiring tine 16fa on the display region D side and the lower layer wiring line 16fa on the terminal section T side through contact holes 62 formed in the interlayer insulating film 21. The upper layer wiring line 16fb is covered with the flattening film 17 provided in the frame region F. The wiring line terminal 16t is also connected to the lower layer wiring line 16fa through a contact hole 63 formed in the interlayer insulating film 21 in a similar manner to the upper layer wiring line 16fb. The upper layer wiring line 16fb and the wiring line terminal 16t are formed of a material identical to a material of the first electrode 41 in a layer identical to a layer of the first electrode 41.

In the organic EL display device 1 having the configuration described above, the organic EL element 40 is brought into a non-light-emitting state when the corresponding emission wiring line 16e is selected to be in an off state in each subpixel 6. In this state, an initialization signal is applied to the corresponding initialization voltage wiring line 16v and also the preceding gate wiring line 16g(n−1) is selected, thereby, a gate signal is input to the first TFT 14a via the preceding gate wiring line 16g(n−1), and then, the first TFT 14a is brought into an on state and a voltage of the corresponding initialization voltage wiring line 16v is applied to the capacitor 15. Thereby, the charge of the capacitor 15 is discharged to initialize the voltage applied to the gate electrode 20 of the fourth TFT 14d. Next, the corresponding gate wiring line 16g(n) is selected and gate signals are input to the second TFT 14b, the third TFT 14c, and the fourth TFT 14d, thereby, the second TFT and the third TFT are brought into an on state, a predetermined voltage corresponding to a source signal transmitted through the corresponding source wiring line 16s is written to the capacitor 15 via the fourth TFT 14d in the diode-connected state and the seventh TFT 14g is brought into an on state, and then, an initialization signal is applied to the first electrode 41 of the organic EL element 40 via the corresponding initialization voltage wiring line 16v, and the charge accumulated in the first electrode 41 is reset. Thereafter, the corresponding emission wiring line 16e is selected, and light emission control signals are input to the fifth TFT 14e and the sixth TFT 14f via the corresponding emission wiring line 16e, thereby, the fifth TFT 14e and the sixth TFT 14f are brought into an on state, and then, a drive current depending on the voltage applied to the gate electrode 20 of the fourth TFT 14d is supplied from the corresponding high-level power source wiring line 16hp to the organic EL element 40. As a result, the organic EL layer 42 emits light at a luminance corresponding to the drive current, and the image display is performed.

Manufacturing Method of Organic EL Display Device

Figure 9:
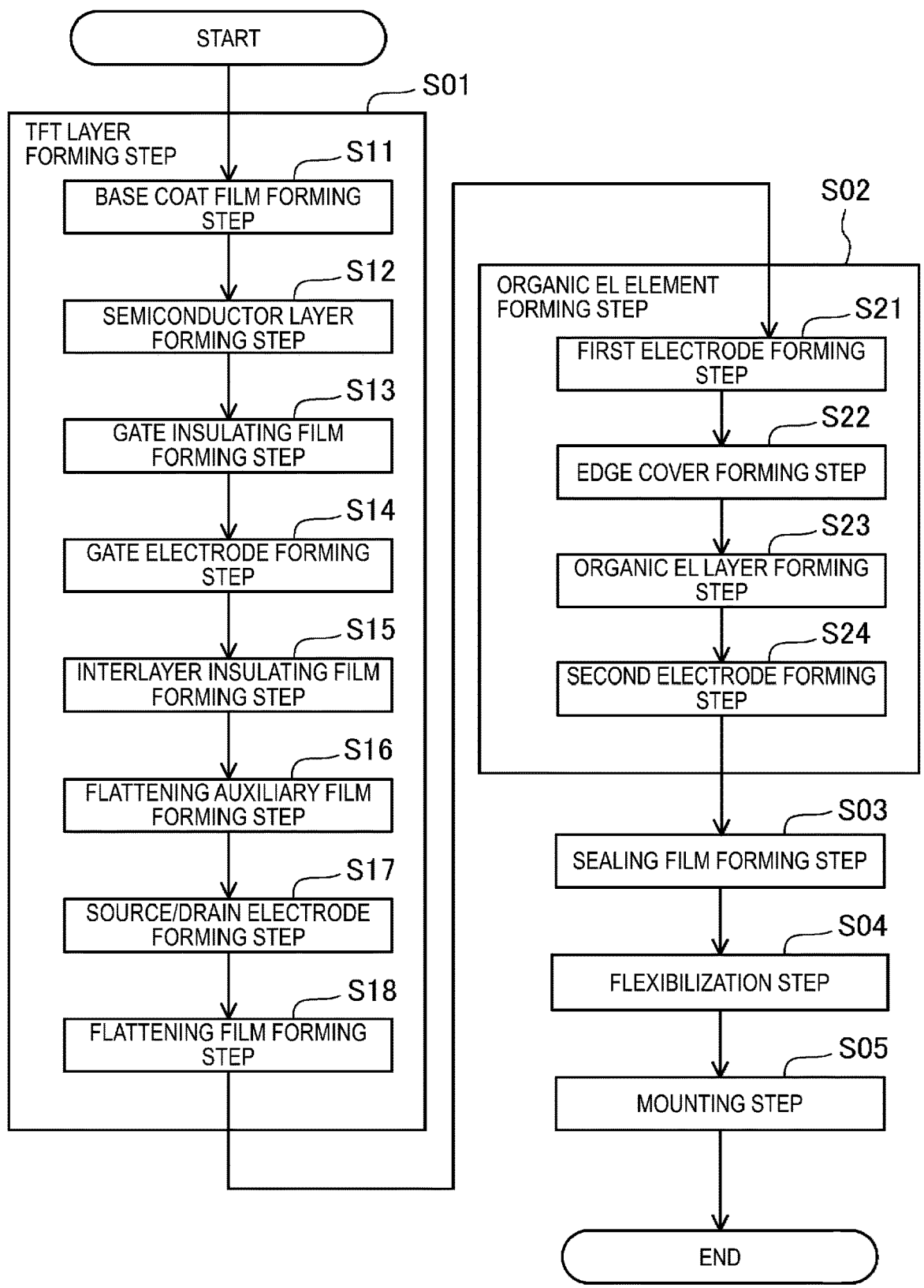
FIG. 9 is a schematic flowchart of a manufacturing method of the organic EL display device according to the first embodiment.

FIG. 9 is a flowchart schematically illustrating a manufacturing method of the organic EL display device 1. As illustrated in FIG. 9, the manufacturing method of the organic EL display device 1 includes a TFT layer forming step S01, an organic EL element layer forming step S02, a sealing film forming step S03, a flexibilization step S04, and a mounting step S05.

TFT Layer Forming Step

The TFT layer forming step S01 includes a base coat film forming step S11, a semiconductor layer forming step S12, a gate insulating film forming step S13, a gate electrode forming step S14, an interlayer insulating film forming step S15, a flattening auxiliary film forming step S16, a source/drain electrode forming step S17, and a flattening film forming step S18. Here, each of the base coat film forming step S11, the gate insulating film forming step S13, and the interlayer insulating film forming step S15 is an example of an inorganic insulating film forming step. The source/drain electrode forming step S16 is an example of a conductive portion forming step.

In the base coat film forming step S01, an inorganic insulating film made of silicon oxide (SiOx), silicon nitride (SiNx), silicon oxynitride (SiOxNy; x>y), silicon nitride oxide (SiNxOy; x>y), or the like is formed by, for example, plasma chemical vapor deposition (CVD) on a surface of the resin substrate layer 7 formed on a glass substrate, to form the base coat film 13.

In the semiconductor layer forming step S12 performed next, a semiconductor film is formed by, for example, CVD on the resin substrate layer 7 on which the base coat film 13 is formed, the semiconductor film is subjected to a crystallization treatment or a low-resistance treatment as necessary, and thereafter, the semiconductor film is patterned by photolithography (resist coating, prebaking, exposing, developing, postbaking, etching, and resist peeling processes) to form the semiconductor layer 18.

In the gate insulating film forming step S13 performed next, an inorganic insulating film made of silicon oxide (SiOx), silicon nitride (SiNx), silicon oxynitride (SiOxNy; x>y), silicon nitride oxide (SiNxOy; x>y), or the like is formed as a single-layer film or a layered film on the resin substrate layer 7 on which the semiconductor layer 18 is formed, to form the gate insulating film 19.

In the gate electrode forming step S14 performed next, a titanium film, an aluminum film, and a titanium film are formed in this order by, for example, sputtering to form a layered conductive film on the resin substrate layer 7 on which the gate insulating film 19 is formed, and thereafter, the layered conductive film is patterned by photolithography to form the gate electrode 20. At this time, the gate wiring line 16g, the emission wiring line 16e, the lower layer electrode 27 of the capacitor 15, the various lead wiring lines 16f, and the like are also formed from the layered conductive film that forms the gate electrode 20.

In the interlayer insulating film forming step S15 performed next, an inorganic insulating film made of silicon oxide (SiOx), silicon nitride (SiNx), silicon oxynitride (SiOxNy; x>y), silicon nitride oxide (SiNxOy; x>y), or the like is formed by, for example, CVD on the resin substrate layer 7 on which the gate electrode 20 is formed, to form the first interlayer insulating film 24.

Subsequently, a titanium film, an aluminum film, and a titanium film are formed in this order by, for example, sputtering to form a layered conductive film on the first interlayer insulating film 24, and thereafter, the layered conductive film is patterned by photolithography, to form the initialization voltage wiring line 16v and the upper layer electrode 28 of the capacitor.

Then, an inorganic insulating film made of silicon oxide (SiOx), silicon nitride (SiNx), silicon oxynitride (SiOxNy; x>y), silicon nitride oxide (SiNxOy; x>y), or the like is formed by, for example, CVD on the first interlayer insulating film 24 on which the initialization voltage wiring line 16v and the upper layer electrode 28 of the capacitor are formed, to form the second interlayer insulating film 25.

In this manner, the interlayer insulating film 21 is formed in which the first interlayer insulating film 24 and the second interlayer insulating film 25 are layered. The interlayer insulating film 21 is then patterned by photolithography to form the contact holes 26, 31, 33, 37, and 38, and the slit 60. At this time, the contact holes 26 are also formed in the gate insulating film 19, and the slit 60 is also formed in the gate insulating film 19 and the base coat film 13.

In the flattening auxiliary film forming step S16 performed next, a photosensitive resin material such as photosensitive epoxy resin is applied to the resin substrate layer 7 on which the interlayer insulating film 21 is formed, by a known application method such as, for example, a spin coating method. Then, the prebaking, exposing, developing, and postbaking processes are performed on the photosensitive resin material applied film to be patterned to form the flattening auxiliary film 50 in a position where the gap between the adjacent conductive portions 39 is formed. At this time, the frame flattening film 61 is formed from the applied film that forms the flattening auxiliary film 50, to fill the slit 60. In patterning the applied film at this time, the flattening auxiliary film 50 is formed thicker than the frame flattening film 61 by using a gray tone mask in the exposing process to adjust an amount of exposure to be different between a formation region of the flattening auxiliary film 50 and a formation region of the frame flattening film 61 in the applied film. Note that here, a halftone mask may be used instead of the gray tone mask.

In the source/drain electrode forming step S17 performed next, a titanium an aluminum film, and a titanium film are formed in this order by, for example, sputtering on the resin substrate layer 7 on which the flattening auxiliary film 50 is formed, to form a layered conductive film. The layered conductive film is then patterned by photolithography to form the source electrode 22 and the drain electrode 23. At this time, the source wiring line 16s, the high-level power source wiring line 16hp, and the connection wiring lines 32, 34, and 35 are also formed from the layered conductive film that forms the source electrode 22 and the drain electrode 23. In this manner, in the source/drain electrode forming step S16, the plurality of conductive portions 39 are formed to be adjacent to each other at intervals at a position overlapping the first electrode 41.

In the flattening film forming step S18 performed next, a photosensitive resin material such as photosensitive epoxy resin is applied to the resin substrate layer 7 on which the source electrode 22 and the drain electrode 23 are formed, by a known application method such as, for example, a spin coating method. Then, the prebaking, exposing, developing, and postbaking processes are performed on a film obtained by the application of the photosensitive resin material, to be patterned to form the flattening film 17, to cover the plurality of conductive portions 39 and the flattening auxiliary film 50.

In this manner, in the TFT layer forming step S01, the TFT layer 8 is formed on the resin substrate layer 7.

Organic EL Element Layer Forming Step

The organic EL element layer forming step S02 includes a first electrode forming step S21, an edge cover forming step S22, an organic EL layer forming step S23, and a second electrode forming step S24. Here, the organic EL layer forming step S23 is an example of a light emission function layer forming step.

In the first electrode forming step S21, an indium tin oxide (ITO) film, a silver alloy film, and an indium tin oxide (ITO) film are formed in this order by, for example, sputtering on the resin substrate layer 7 on which the TFT layer 8 is formed, to form a layered conductive film. The layered conductive film is then patterned by photolithography to form the first electrodes 41.

In the edge cover forming step S22 performed next, a photosensitive resin material such as photosensitive epoxy resin is applied to the resin substrate layer 7 on which the first electrodes 41 are formed, by a known application method such as, for example, a spin coating method. Then, the prebaking, exposing, developing, and postbaking processes are performed on a film obtained by applying the photosensitive resin material, to be patterned to form the edge cover 44.

In the organic EL layer forming step S23 performed next, the hole injection layer 45, the hole transport layer 46, the light-emitting layer 47, the electron transport layer 48, and the electron injection layer 49 are formed in this order by, for example, a vacuum vapor deposition technique on the resin substrate layer 7 on which the edge cover 44 is formed, by using a film formation mask, referred to as a fine metal mask (FMM) capable of patterning in units of subpixel, to form the organic EL layer 42 on the individual first electrodes 41. Some of the above layers may be formed by using a film formation mask, referred to as a common metal mask (CMM) capable of patterning in units of display panel.

In the second electrode forming step S24 performed next, a silver alloy film is formed by, for example, a vacuum vapor deposition technique on the resin substrate layer 7 on which the organic EL layer 42 is formed, by using a film formation mask of a common metal mask (CMM), to form the second electrode 43.

In this manner, in the organic EL element layer forming step S02, the organic EL element layer 9 including the plurality of organic EL elements 40 is formed on the TFT layer 8.

Sealing Film Forming Step

In the sealing film forming step S03, an inorganic insulating film made of silicon oxide (SiOx), silicon nitride (SiNx), silicon oxynitride (SiOxNy; x>y), silicon nitride oxide (SiNxOy; x>y), or the like is formed as a single-layer film or a layered film by, for example, CVD on the resin substrate layer 7 on which the organic EL element layer 9 is formed, by using a film formation mask, to form the first inorganic sealing film 53.

Subsequently, an organic material such as an acrylic resin is applied to the resin substrate layer 7 on which the first inorganic sealing film 53 is formed, by, for example, an ink-jet method, to form the organic sealing film 54.

Then, an inorganic insulating film made of silicon oxide (SiOx), silicon nitride (SiNx), silicon oxynitride (SiOxNy; x>y), silicon nitride oxide (SiNxOy; x>y), or the like is formed as a single-layer film or a layered film by, for example, CVD on the resin substrate layer 7 on which the organic sealing film 54 is formed, by using a film formation mask, to form the second inorganic sealing film 55.

In this manner, in the sealing film forming step S03, the sealing film 10 is formed in which the first inorganic sealing film 53, the organic sealing film 54, and the second inorganic sealing film 55 are layered.

Flexibilization Step

In the flexibilization step S03, a surface protection film is applied to the surface of the resin substrate layer 7 on which the sealing film 10 is formed, thereafter, the glass substrate is peeled from the lower face of the resin substrate layer 7 by irradiating the lower surface of the resin substrate layer 7 with laser light from the glass substrate side of the resin substrate layer 7, and a back surface protection film is further applied to the lower face of the resin substrate layer 7 where the glass substrate is peeled.

Mounting Step

In the mounting step S05, the wiring line substrate is connected to the terminal section T of the substrate that is obtained by peeling the glass substrate from the resin substrate layer 7, by using a conductive material such as an anisotropic conductive film (ACF) or an anisotropic conductive paste (ACP) to make the wiring line substrate and the wiring line terminal 16t conduct to each other, and the wiring line substrate and the display control circuit are mounted.

The organic EL display device 1 can be manufactured as described above.

According to the organic EL display device 1 in the first embodiment, the flattening auxiliary film 50 is provided between the adjacent conductive portions 39 on the interlayer insulating film 21 at the position overlapping the first electrode 41 of the organic EL element 40 in the TFT layer 8, and the flattening film 17 is provided to cover both the flattening auxiliary film 50 and the conductive portions 39, and thus, the gap between the adjacent conductive portions 39 is interpolated by the flattening auxiliary film 50, and in a state in which the gap is narrowed, the surface of the TFT layer 8 is flattened by the flattening film 17. As a result, the steps caused by the conductive portions 39 can be reliably filled with the flattening film 17 to suppress generation of the unevenness of the surface of the flattening film 17, and the flattening accuracy of the surface of the TFT layer 8 can be improved. As a result, the light extraction efficiency can be prevented from being reduced in the organic EL element layer 9 in the organic EL display device 1 that performs high-resolution image display.

Modification Example of First Embodiment

Figure 10:
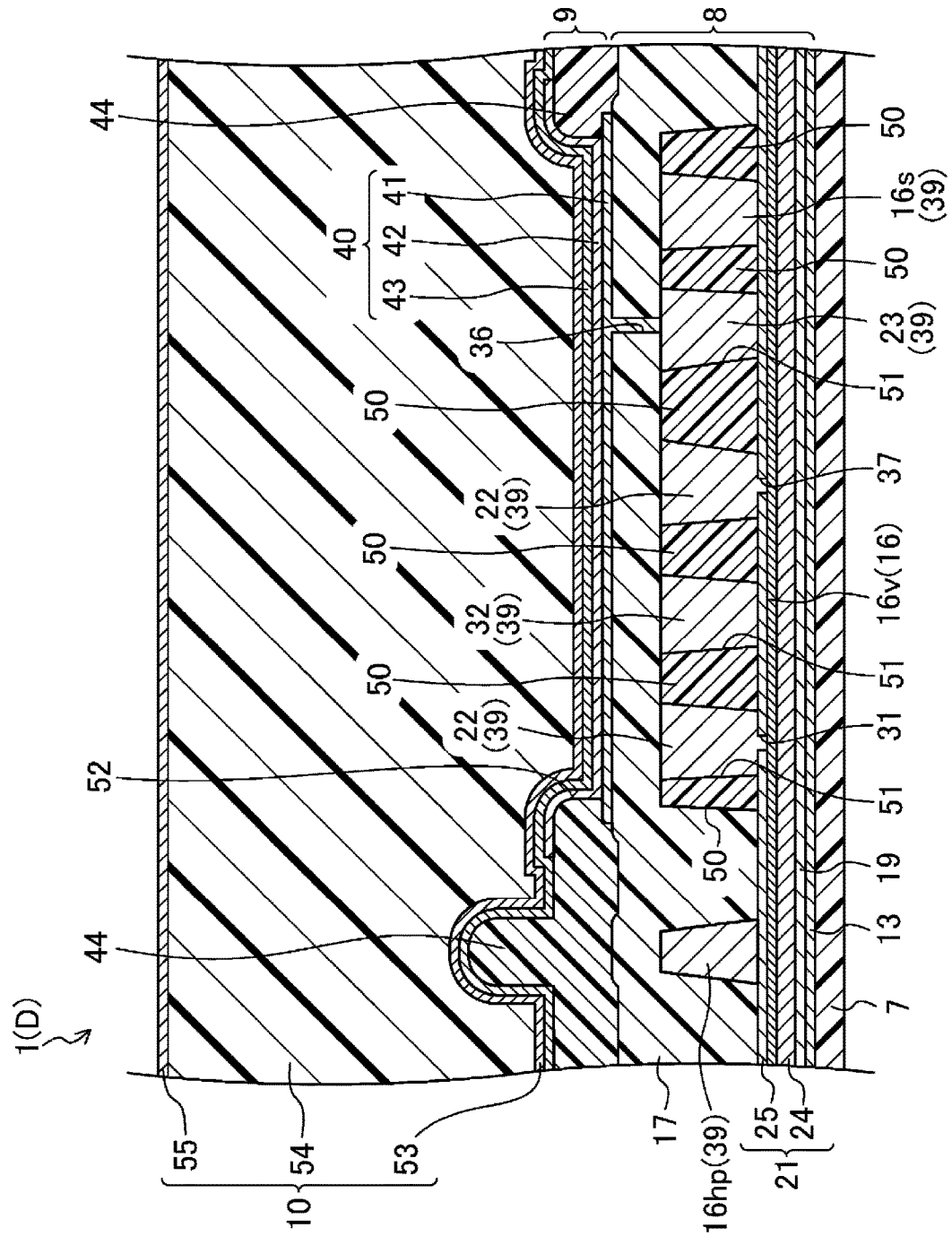
FIG. 10 is a view equivalent to FIG. 5 of an organic EL display device according to a modification example of the first embodiment.

FIG. 10 is a view equivalent to FIG. 5 of an organic EL display device 1 according to a modification example of this embodiment. In the organic EL display device 1 according to the first embodiment, the gap s is provided between each flattening auxiliary film 50 and a corresponding conductive portion 39. However, in the organic EL display device 1 according to this modification example, as illustrated in FIG. 10, an end portion of each flattening auxiliary film 50 and an end portion of the corresponding conductive portion 39 overlap in a manner that side surfaces of the end portions tightly contact each other.

Specifically, the flattening auxiliary film 50 is formed to be widened toward the interlayer insulating film 21, and has inclined side surfaces 51 inclined with respect to the thickness direction of the flattening auxiliary film 50. The conductive portion 39 is formed to ride on the inclined side surfaces 51 of the flattening auxiliary film 50. The inclined side surfaces 51 of the flattening auxiliary film 50 overlap the end portion of the conductive portion 39. In this manner, the flattening auxiliary film 50 and the conductive portion 39 are provided with no gap therebetween, and the gap between the adjacent conductive portions 39 at the position overlapping the first electrode 41 is completely filled and eliminated by the flattening auxiliary film 50.

According to the organic EL display device 1 in the modification example, since the flattening auxiliary film 50 and the conductive portion 39 are provided so as to eliminate the gap between the flattening auxiliary film 50 and the conductive portion 39, the unevenness of the surface of the flattening film 17 caused by the gap can be prevented from being generated, and the flattening accuracy of the surface of the TFT layer 8 can be further improved.

Second Embodiment

Figure 11:
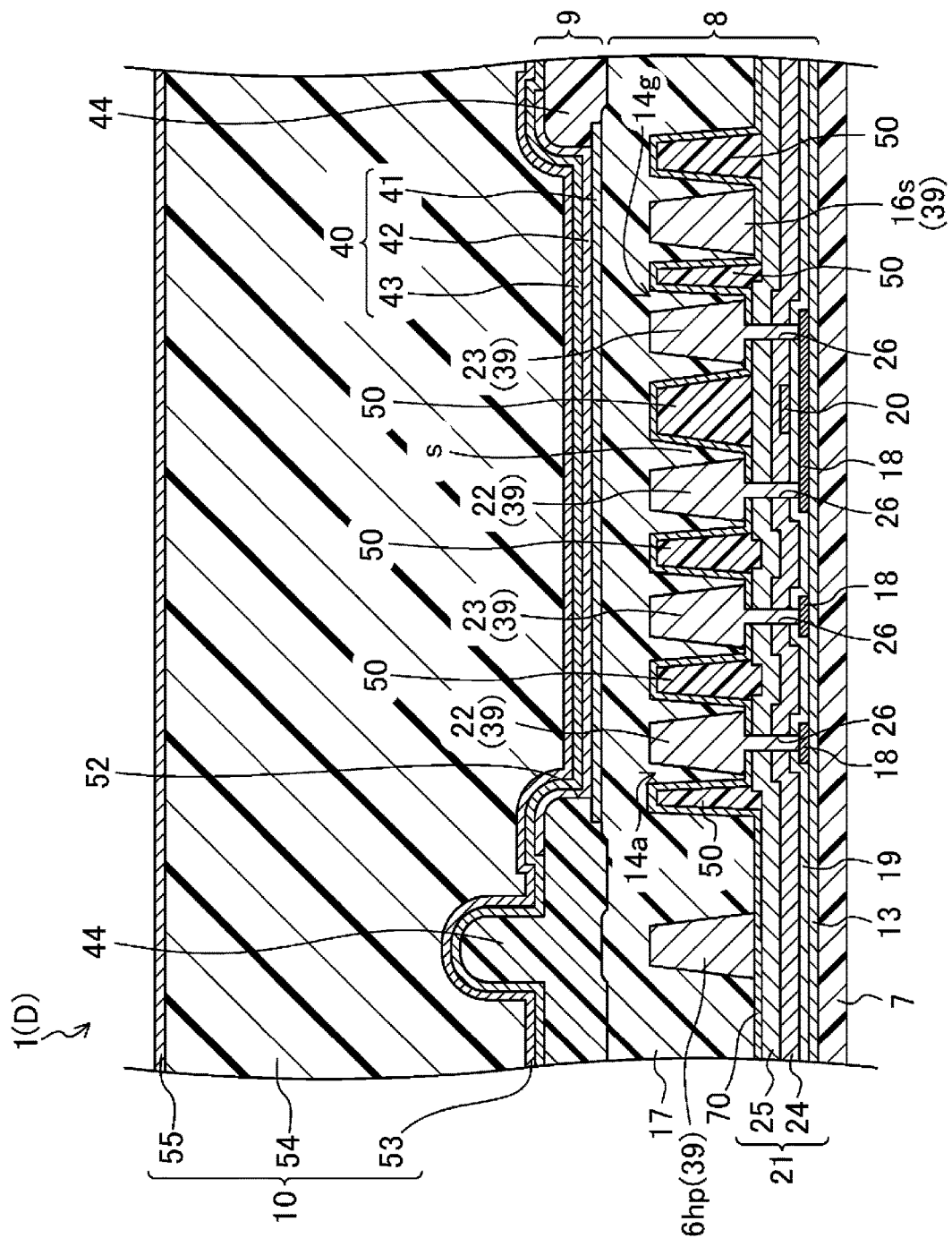
FIG. 11 is a view equivalent to FIG. 4 of an organic EL display device according to a second embodiment.
Figure 12:
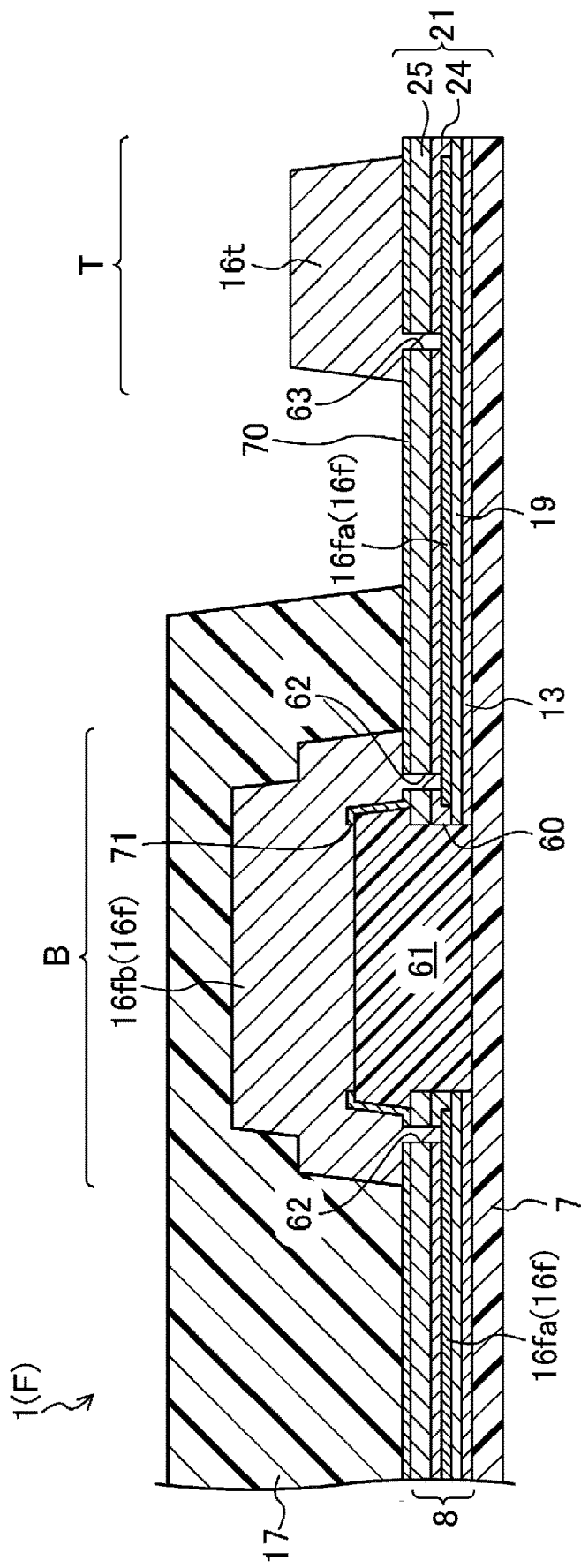
FIG. 12 is a view equivalent to FIG. 8 of the organic EL display device according to the second embodiment.

FIG. 11 is a view equivalent to FIG. 4 of an organic EL display device 1 according to a second embodiment. FIG. 12 is a view equivalent to FIG. 8 of the organic EL display device 1 according to the second embodiment. The organic EL display device 1 according to the second embodiment differs from the first embodiment in the configuration of the TFT layer 8. Note that in the second embodiment, the organic EL display device 1 is configured in a similar manner to the first embodiment except that the configuration of the TFT layer 8 is different from the first embodiment, and thus, only the TFT layer 8 having the different configuration is described, the same configuration is to be referred to the description in the first embodiment based on FIG. 1 to FIG. 9, and detailed descriptions thereof will be omitted.

As illustrated in FIG. 11, the TFT layer 8 of the organic EL display device 1 according to the second embodiment includes a protection film 70 provided to cover the flattening auxiliary film 50 at least in the display region D. The protection film 70 is located on the interlayer insulating film 21 and includes a single-layer film or a layered film of an inorganic insulating layer of, for example, silicon oxide (SiOx), silicon nitride (SiNx), silicon oxynitride (SiOxNy; x>y), silicon nitride oxide (SiNxOy; x>y), or the like.

The source wiring line 16s, the high-level power source wiring line 16hp, the source electrodes 22 and drain electrodes 23 of the first to seventh TFTs 14a, 14b, 14c, 14d, 14e, 14f, and 14g, and the conductive portions 39 such as the connection wiring lines 32, 34, and 35 are provided on the protection film 70. As described in the first embodiment, in the case where a procedure is employed in which the conductive portions 39 are formed after the flattening auxiliary film 50 is formed on the interlayer insulating film 21 in the manufacturing of the organic EL display device 1, dust may be generated from the flattening auxiliary film 50 caused by dry etching in patterning the conductive portions 39. The protection film 70 serves to protect the flattening auxiliary film 50 from dry etching in forming such conductive portions 39, and prevent dust from generating from the flattening auxiliary film 50 caused by dry etching in forming the conductive portions 39.

As illustrated in FIG. 12, such a protection film 70 is also provided in the frame region F, and is formed to cover a peripheral edge portion of the frame flattening film 61 in the bending portion B. An opening 71 exposing the frame flattening film 61 at the bending portion B is formed in the protection film 70. The opening 71 is formed in a region corresponding to the slit 60, in other words, at a location corresponding to a portion where the inorganic insulating films 13, 19, and 21 of the TFT layer 8 are removed. As a result, the protection film 70 that protects the flattening auxiliary film 50 and prevents dust from generating is formed, while the flexibility of the bending portion B is not impaired.

According to the organic EL display device 1 of the second embodiment, since the protection film 70 that protects the flattening auxiliary film 50 is provided in a lower layer than the conductive portions 39, the flattening auxiliary film 50 is protected by the protection film 70 when dry etching is performed in forming the conductive portions 39, and the generation of dust from the flattening auxiliary film 50 caused by dry etching can be prevented. As a result, generation of foreign matter in the display region D can be suppressed, and manufacturing efficiency and reliability of the organic EL display device 1 can be increased.

As described above, the preferred embodiments and the modification examples of the embodiments are described as examples of the technique of the present disclosure. However, the technique of the present disclosure is not limited to the embodiments and the modification examples, and is also applicable to an embodiment in which modification, replacement, adding, omission, and the like are suitably made. The constituent elements described in the embodiments and modification examples described above can be combined into a new embodiment. The constituent elements described in the accompanying drawings and detailed description may also include constituent elements that are not essential for the purpose of solving the problems. As such, those constituent elements that are not essential should not be recognized as being essential immediately as described in the accompanying drawings and detailed description.

For example, in the first embodiment, the thickness of the flattening auxiliary film 50 is set equal to or greater than the thickness of the conductive portions 39, but the scope of application of the technique of the present disclosure is not limited thereto. The thickness of the flattening auxiliary film 50 may be thinner than the thickness of the conductive portions 39. In summary, by providing the flattening auxiliary film 50 between the adjacent conductive portions 39, the unevenness of the surface of the flattening film 17 can be reduced and the flattening accuracy of the surface of the TFT layer 8 can be improved as compared with a case where the flattening auxiliary film 50 is not provided.

Additionally, in the first embodiment described above, the organic EL layer 42 is formed for each of the subpixels 6, but the scope of application of the technique of the present disclosure is not limited thereto. The organic EL layer 42 may be provided and shared by the plurality of subpixels 6. In this case, the organic EL display device 1 may include a color filter to perform color tone expression of each of the subpixels 6.

In the first embodiment, a stripe arrangement is illustrated in which the subpixels 6r, 6g, and 6b of the three colors constituting each of the pixels 5 are adjacent in a stripe shape, but the scope of application of the technique of the present disclosure is not limited thereto. The subpixels 6 constituting each pixel 5 is not limited to three colors, and may be four or more colors. The arrangement of the plurality of subpixels 6 constituting each pixel 5 may be arranged in other arrangements such as a PenTile arrangement.

Additionally, in the first embodiment, the organic EL display device 1 using the resin substrate layer 7 as a substrate is illustrated, but the scope of application of the technique of the present disclosure is not limited thereto. As the substrate, a substrate including an inorganic material such as glass and quartz, plastic such as polyethylene terephthalate, and ceramic such as alumina may be used. Additionally, the substrate may be a substrate being a metal substrate such as aluminum and iron including one surface coated with silica gel, an organic insulating material, or the like, or a substrate being a metal substrate including a surface subjected to insulation treatment by a method such as anode oxidation.

In the first embodiment, the top gate structure is employed for the first to seventh TFTs 14a, 14b, 14c, 14d, 14e, 14f, and 14g, but the scope of application of the technique of the present disclosure is not limited thereto. The first to seventh TFTs 14a, 14b, 14c, 14d, 14e, 14f, and 14g may employ a bottom gate structure.

In the first embodiment, the organic EL display device 1 having the first electrode 41 as the anode electrode and the second electrode 43 as the cathode electrode is illustrated, but the scope of application of the technique of the present disclosure is not limited thereto. The technique of the present disclosure is also applicable to, for example, the organic EL display device 1 including the organic EL layer 42 including a reversed layered structure in which the first electrode 41 is a cathode electrode and the second electrode 43 is an anode electrode.

In the first embodiment, the organic EL layer 42 of a five-layer layered structure including the hole injection layer 45, the hole transport layer 46, the light-emitting layer 47, the electron transport layer 48, and the electron injection layer 49 is illustrated, but the scope of application of the technique of the present disclosure is not limited thereto. For example, the organic EL layer 42 may employ a three-layer layered structure including a hole injection-cum-transport layer, a light-emitting layer, and an electron transport-cum-injection layer, and can employ any structure.

In the first and second embodiments, the organic EL display device 1 is illustrated as an example of the display device, but the scope of application of the technique of the present disclosure is not limited thereto. The technique of the present disclosure is applicable to a display device including a plurality of current-driven light-emitting elements, for example, a display device including a quantum dot light-emitting diode (QLED) that is a light-emitting element using a quantum dot-containing layer.

INDUSTRIAL APPLICABILITY

As described above, the technique of the present disclosure is useful for a display device in which a light-emitting element layer such as an organic EL element, layer is provided on a TFT layer.

The invention claimed is:
1. A display device comprising:
a substrate having flexibility and made of resin,
a thin film transistor (TFT) layer provided on the substrate,
a light-emitting element layer provided on the TFT layer,
a display region configured to display an image through light emission in the light-emitting element layer, and a frame region is located around the display region,
the TFT layer including an inorganic insulating film, a conductive portion provided on the inorganic insulating film, and a flattening film covering the conductive portion,
the light-emitting element layer including a first electrode provided on the flattening film, a light emission function layer provided on the first electrode, and a second electrode overlapping the first electrode with the light emission function layer interposed between the second electrode and the first electrode,
a terminal section provided at an end portion of the frame region,
a bending portion provided in the frame region located between the display region and the terminal section,
a slit formed in the inorganic insulating film, a frame flattening film filling the slit,
a plurality of the conductive portions provided below the first electrode and conductive portions of the plurality of conductive portions adjacent to each other at intervals, and
a flattening auxiliary film provided between every adjacent conductive portions of the plurality of conductive portions, the flattening auxiliary film formed of a material identical to a material of the frame flattening film in a layer identical to a layer of the frame flattening film, the flattening auxiliary film and the conductive portions covered by the flattening film.
2. The display device according to claim 1,
wherein the plurality of conductive portions includes a source wiring line transmitting a source signal to the display region.
3. The display device according to claim 1,
wherein the plurality of conductive portions includes a power source wiring line flowing a current to the light-emitting element layer.
4. The display device according to claim 1,
wherein the plurality of conductive portions includes a connection wiring line electrically connecting elements of the TFT layer to each other.
5. The display device according to claim 1,
wherein the frame region is provided with a lead wiring line, the lead wiring line being electrically connected to a wiring line in the display region and crossing the slit on the frame flattening film, and
the lead wiring line is covered with the flattening film.
6. The display device according to claim 1,
wherein the TFT layer includes a gate wiring line provided in a layer lower than the plurality of conductive portions, and
each of the plurality of conductive portions is formed thinner than the gate wiring line.

7. The display device according to claim 1,
wherein the flattening auxiliary film includes an inclined side surface inclined with respect to a thickness direction of the flattening auxiliary film, and the flattening auxiliary film overlaps an end portion of each of the plurality of conductive portions at the inclined side surface.

8. The display device according to claim 1,
wherein a plurality of first electrodes, including the first electrode, is provided in the display region,
the light-emitting element layer includes an edge cover covering a peripheral edge portion of each of the plurality of first electrodes, and
the flattening auxiliary film is formed in an island shape and overlaps a portion of each of the plurality of first electrodes, the portion being exposed from an opening of the edge cover.

9. The display device according to claim 8,
wherein a plurality of flattening auxiliary films, including the flattening auxiliary film, is provided inside the opening of the edge cover in a plan view.

10. The display device according to claim 1,
wherein the TFT layer includes a protection film made from an inorganic material, the protection film covering the flattening auxiliary film at least in the display region.

11. The display device according to claim 10,
wherein the protection film covers a peripheral edge portion of the frame flattening film at the bending portion.

12. The display device according to claim 10,
wherein an opening is formed in the protection film, the opening exposing the frame flattening film at the bending portion.

13. The display device according claim 1,
wherein a thickness of the flattening auxiliary film is equal to or greater than a thickness of each of the plurality of conductive portions.

* * * * *